(12) United States Patent
Koishi

(10) Patent No.: US 10,180,810 B2
(45) Date of Patent: Jan. 15, 2019

(54) MEMORY CONTROLLER AND STORAGE DEVICE WHICH SELECTS MEMORY DEVICES IN WHICH DATA IS TO BE WRITTEN BASED ON EVALUATION VALUES OF A USABLE CAPACITY OF THE MEMORY DEVICES

(71) Applicant: Kabushiki Kaisha Toshiba, Minato-ku (JP)

(72) Inventor: Masato Koishi, Fuchu (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/450,415

(22) Filed: Mar. 6, 2017

(65) Prior Publication Data
US 2017/0262231 A1 Sep. 14, 2017

(30) Foreign Application Priority Data
Mar. 10, 2016 (JP) .................. 2016-046934

(51) Int. Cl.
*G06F 13/00* (2006.01)
*G06F 3/06* (2006.01)
(Continued)

(52) U.S. Cl.
CPC .......... *G06F 3/0659* (2013.01); *G06F 3/0616* (2013.01); *G06F 3/0679* (2013.01); *G06F 3/0688* (2013.01); *G11C 16/10* (2013.01); *G11C 16/26* (2013.01); *G06F 11/0754* (2013.01); *G06F 12/16* (2013.01); *G06F 2212/1032* (2013.01)

(58) Field of Classification Search
CPC .......... G06F 2212/7211; G06F 3/0659; G06F 3/0679; G06F 3/0616; G06F 11/0754; G06F 12/16; G06F 2212/1032; G11C 16/10; G11C 16/26
USPC .................. 714/704, 773; 711/103, 114
See application file for complete search history.

(56) References Cited

U.S. PATENT DOCUMENTS

2007/0016754 A1* 1/2007 Testardi ................ G06F 3/0611
711/206
2008/0162788 A1* 7/2008 Yu ........................ G06F 12/1009
711/103
(Continued)

FOREIGN PATENT DOCUMENTS

JP 2011-186561 9/2011
JP 2013-61847 4/2013

*Primary Examiner* — Hong C Kim
(74) *Attorney, Agent, or Firm* — Oblon, McClelland, Maier & Neustadt, L.L.P.

(57) ABSTRACT

According to one embodiment, a memory controller includes a memory, an adjustment part, a writing part and a setting change part. The memory stores first data, that includes a write amount with respect to a plurality of regions in a plurality of nonvolatile memories, and second data that includes a write state corresponding to the plurality of nonvolatile memories. The adjustment part selects the nonvolatile memory based on the first data and the second data. The write part writes the data to be written in the selected nonvolatile memory and updates the first data and the second data. The setting change part changes setting of a usable capacity with respect to at least one of the plurality of nonvolatile memories, based on the first data and the second data.

7 Claims, 28 Drawing Sheets

8 Logical extent information table

| Logical extent ID | Logical disk ID | Head logical address | Belonging device ID | Physical extent ID | Read amount (MB) | Write amount (MB) |
|---|---|---|---|---|---|---|
| 0 | $LD_0$ | 00000000000 | D1 | 61 | 19 | 0.5 |
| 1 | $LD_0$ | 00000016384 | D1 | 62 | 4 | 1.3 |
| ... | ... | ... | D1 | ... | ... | ... |
| 10240 | $LD_0$ | 00167772159 | D1 | 661 | 0.0 | 0.0 |
| 10241 | $LD_1$ | 00000000000 | D1 | 771 | 0.0 | 0.0 |
| ... | ... | ... | ... | ... | ... | ... |
| 102399 | $LD_{N-1}$ | 00167772159 | D10 | 991 | 0.0 | 0.0 |

9 Physical extent information table

| Physical extent ID | Belonging device ID | Head physical address | Vacancy information |
|---|---|---|---|
| 0 | $D_1$ | 00000000000 | 0 |
| 1 | $D_1$ | 00000016384 | 1 |
| ... | ... | ... | ... |
| 10240 | $D_1$ | 00167772159 | NULL |
| 10241 | $D_2$ | 00000000000 | 1 |
| ... | ... | ... | ... |
| 102399 | $D_{10}$ | 00167772159 | NULL |

(51) Int. Cl.
  *G11C 16/10*   (2006.01)
  *G11C 16/26*   (2006.01)
  *G06F 12/16*   (2006.01)
  *G06F 11/07*   (2006.01)

(56) References Cited

U.S. PATENT DOCUMENTS

| | | |
|---|---|---|
| 2010/0064111 A1 | 3/2010 | Kunimatsu et al. |
| 2012/0144095 A1* | 6/2012 | Han ................... G06F 12/0246 |
| | | 711/103 |
| 2012/0191900 A1 | 7/2012 | Kunimatsu et al. |
| 2013/0067148 A1 | 3/2013 | Takagi et al. |
| 2014/0040681 A1* | 2/2014 | Wolfman ............ G06F 11/1048 |
| | | 714/704 |
| 2017/0115904 A1* | 4/2017 | Hashimoto ........... G06F 3/0616 |

\* cited by examiner

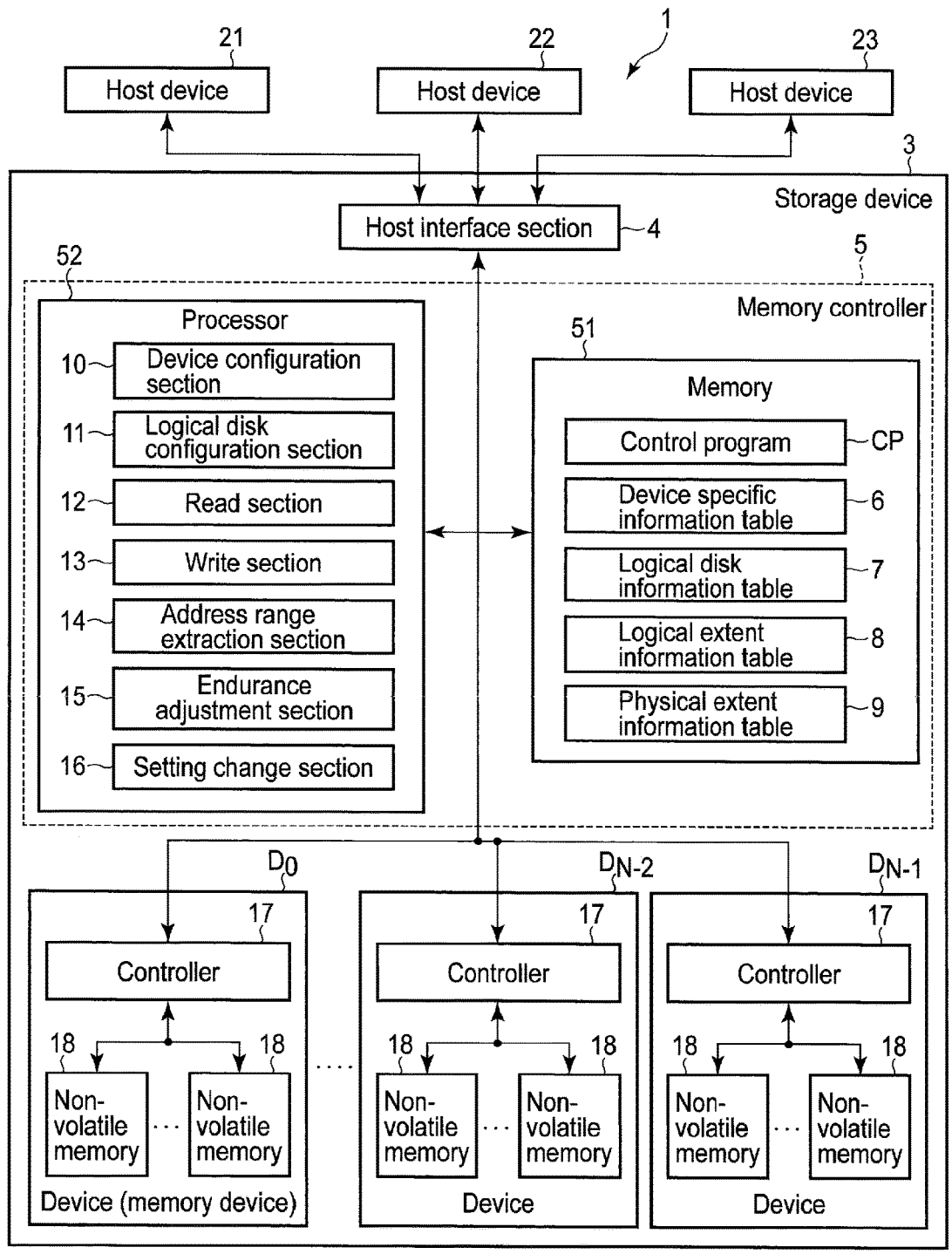
F I G. 1

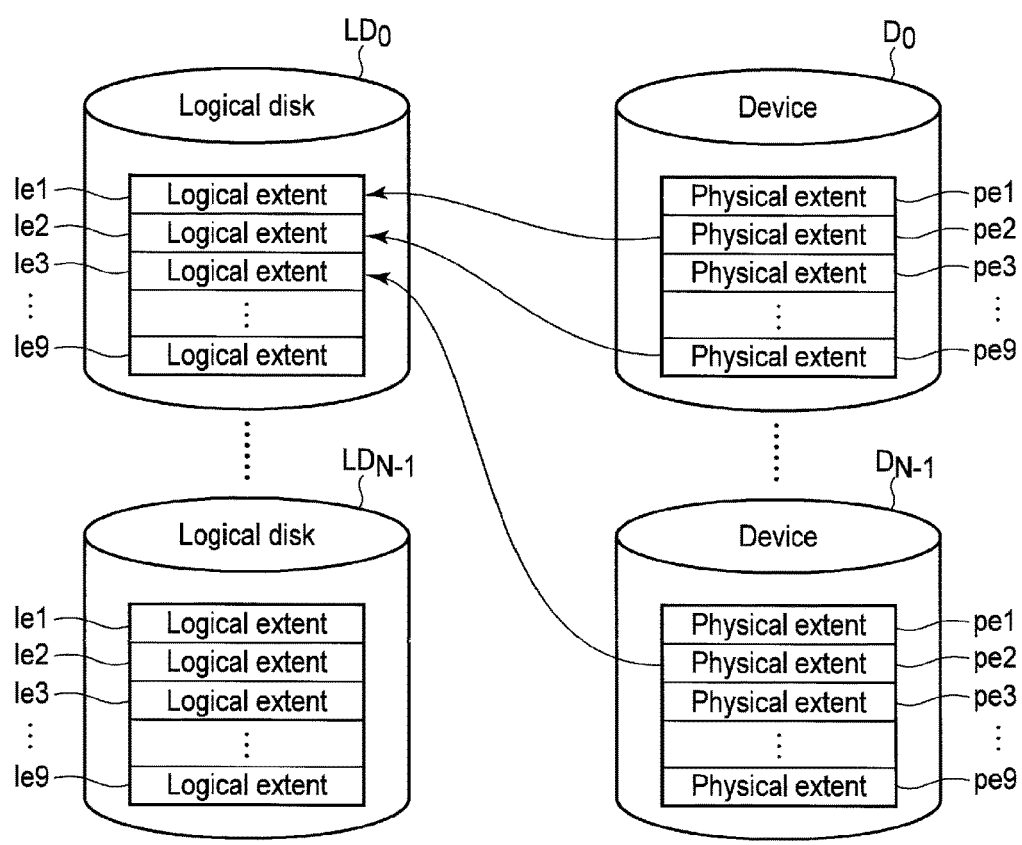
F I G. 2

6 Device specific information table

| Device ID | Maximum capacity (MB) | Logical capacity (MB) | Current used capacity (MB) | Remaining write amount (MB) | Guaranteed write amount (MB/day) | Read amount (MB) | Update amount (MB) | Additionally written amount (MB) | Performance specifications (IOPS) | Maximum load (IOPS) |
|---|---|---|---|---|---|---|---|---|---|---|
| $D_0$ | 102400.0 | 20000.0 | 20000.0 | 4000000.0 | 20480 | 1233 | 123 | 12 | 40000 | 3200 |
| $D_1$ | 102400.0 | 40000.0 | 30000.0 | 5000000.0 | 20480 | 1032 | 100 | 11 | 40000 | 1000 |
| ... | ... | ... | ... | ... | ... | ... | ... | ... | ... | ... |
| $D_{N-1}$ | 102400.0 | 80000.0 | 40000.0 | 4500000.0 | 20480 | 330 | 0 | 0 | 11 | 11 |

F I G. 3

7 Logical disk information table

| Logical disk ID | Logical capacity |
|---|---|
| $LD_0$ | 10240 |
| $LD_1$ | 5120 |
| ... | ... |
| $LD_{N-1}$ | 10240 |

F I G. 4

8 Logical extent information table

| Logical extent ID | Logical disk ID | Head logical address | Belonging device ID | Physical extent ID | Read amount (MB) | Write amount (MB) |
|---|---|---|---|---|---|---|
| 0 | $LD_0$ | 00000000000 | D1 | 61 | 19 | 0.5 |
| 1 | $LD_0$ | 00000016384 | D1 | 62 | 4 | 1.3 |
| ... | ... | ... | D1 | ... | ... | ... |
| 10240 | $LD_0$ | 00167772159 | D1 | 661 | 0.0 | 0.0 |
| 10241 | $LD_1$ | 00000000000 | D1 | 771 | 0.0 | 0.0 |
| ... | ... | ... | ... | ... | ... | ... |
| 102399 | $LD_{N-1}$ | 00167772159 | D10 | 991 | 0.0 | 0.0 |

F I G. 5

9 Physical extent information table
| Physical extent ID | Belonging device ID | Head physical address | Vacancy information |
|---|---|---|---|
| 0 | $D_1$ | 00000000000 | 0 |
| 1 | $D_1$ | 00000016384 | 1 |
| ... | ... | ... | ... |
| 10240 | $D_1$ | 00167772159 | NULL |
| 10241 | $D_2$ | 00000000000 | 1 |
| ... | ... | ... | ... |
| 102399 | $D_{10}$ | 00167772159 | NULL |
F I G. 6
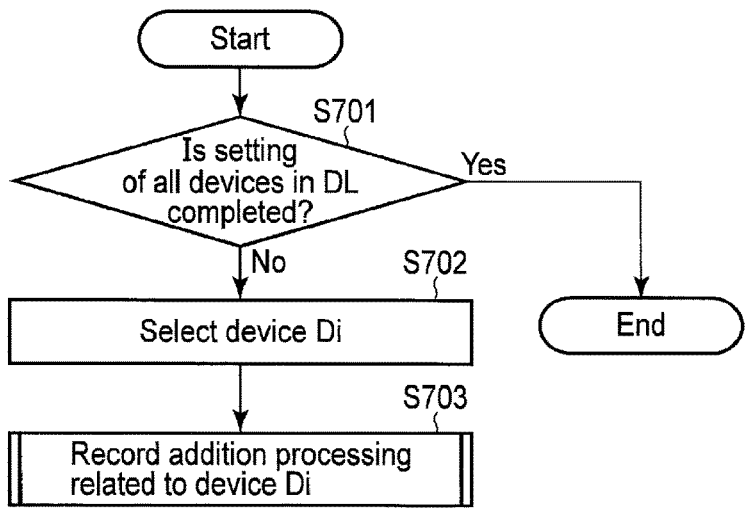
F I G. 7

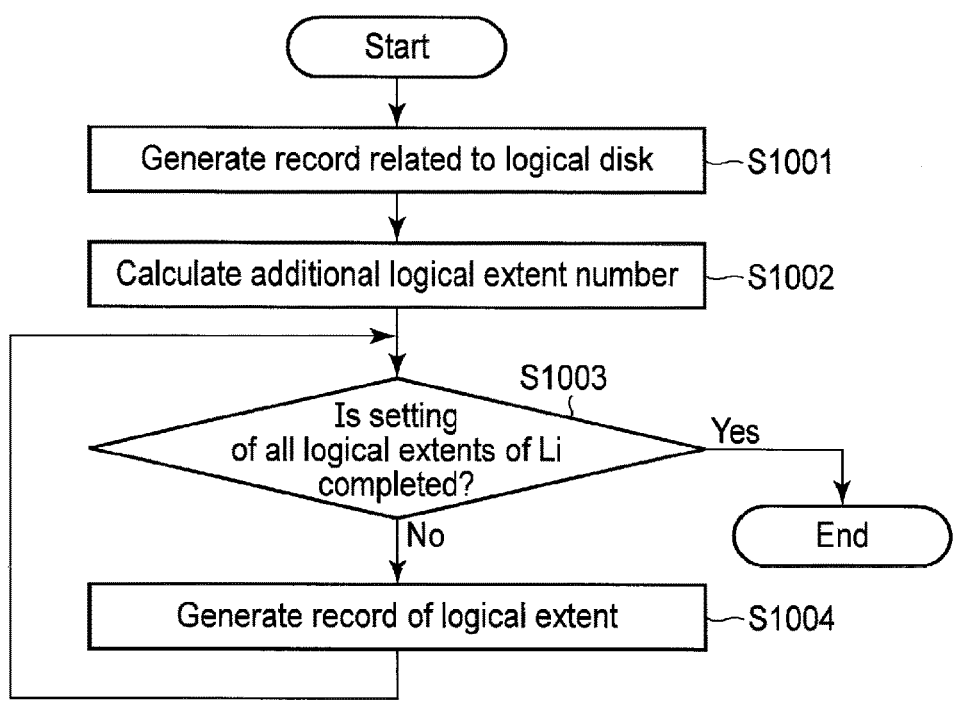
F I G. 10

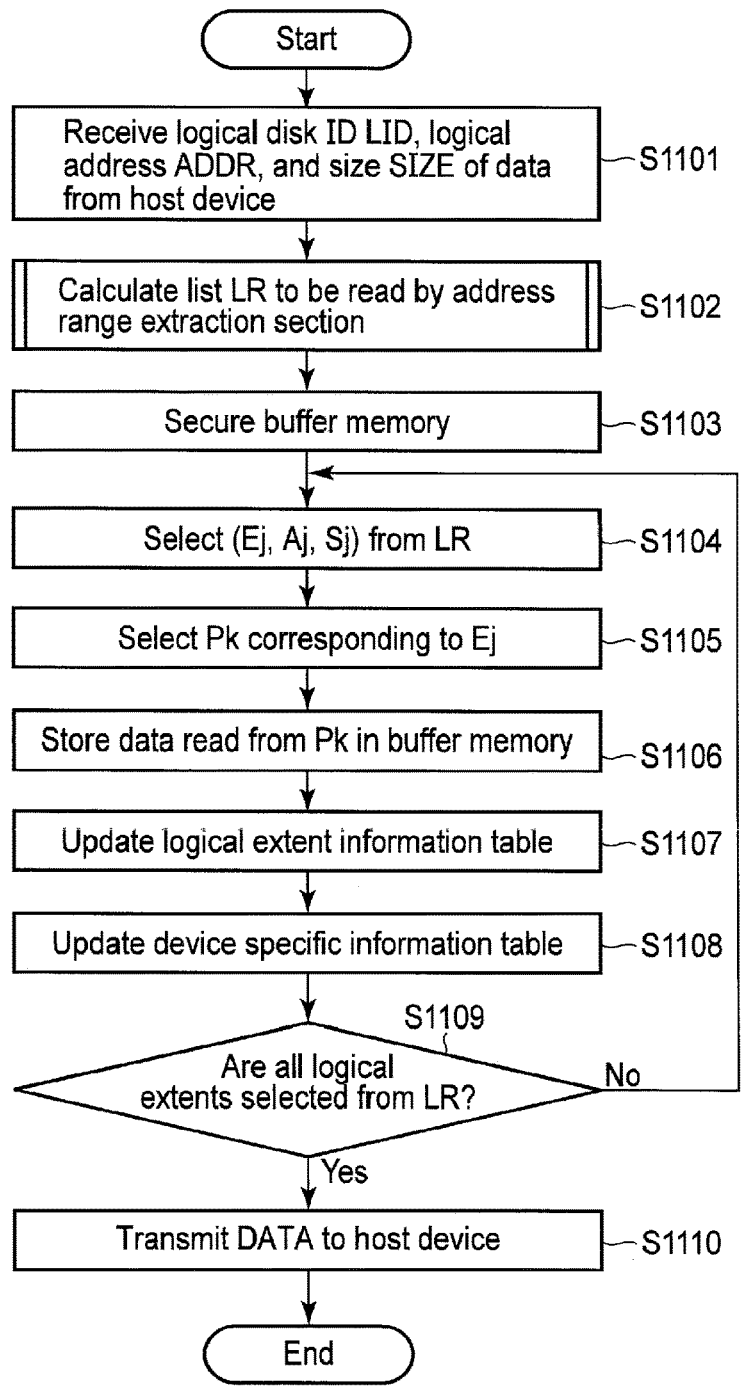
F I G. 11

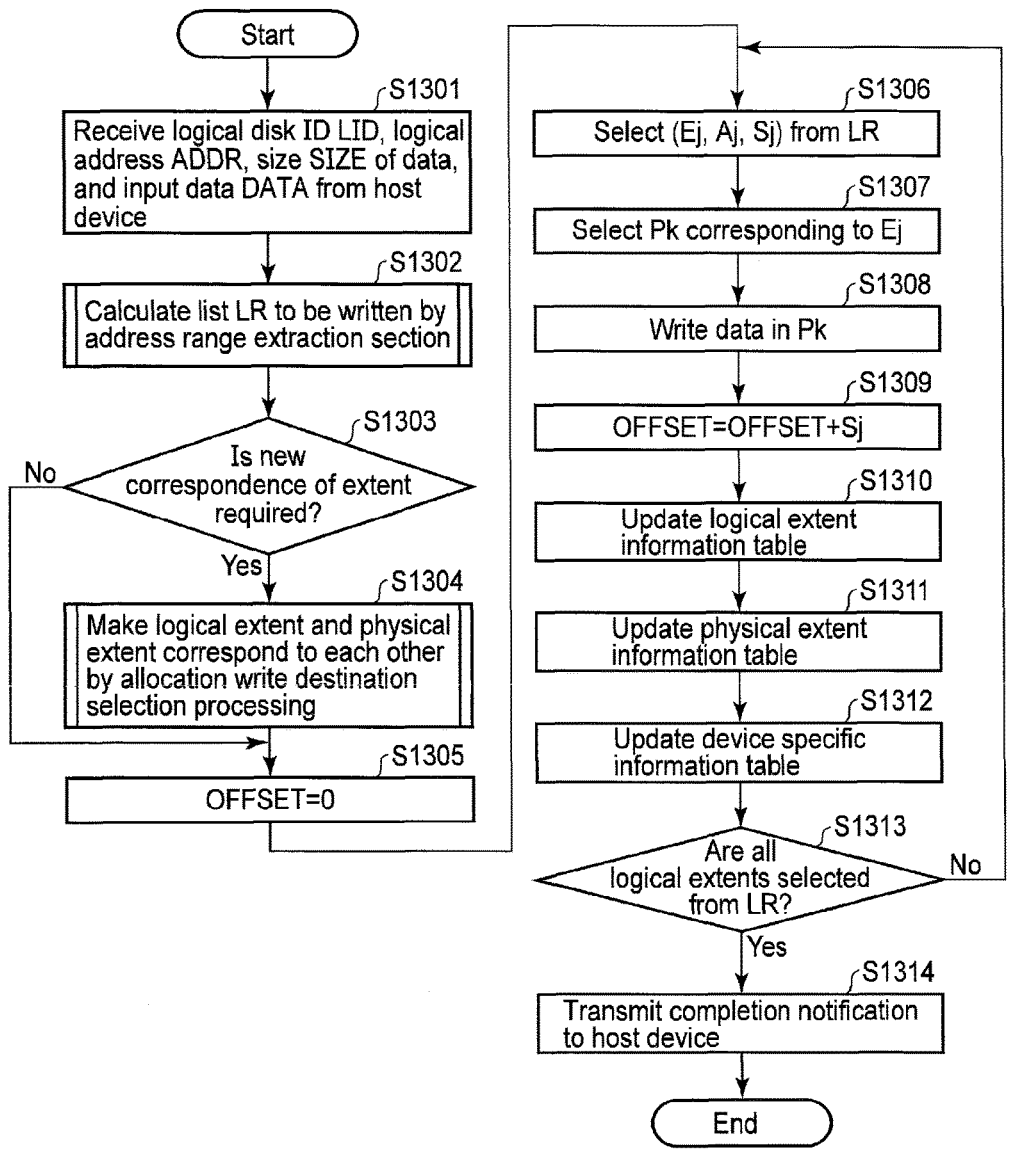
F I G. 13

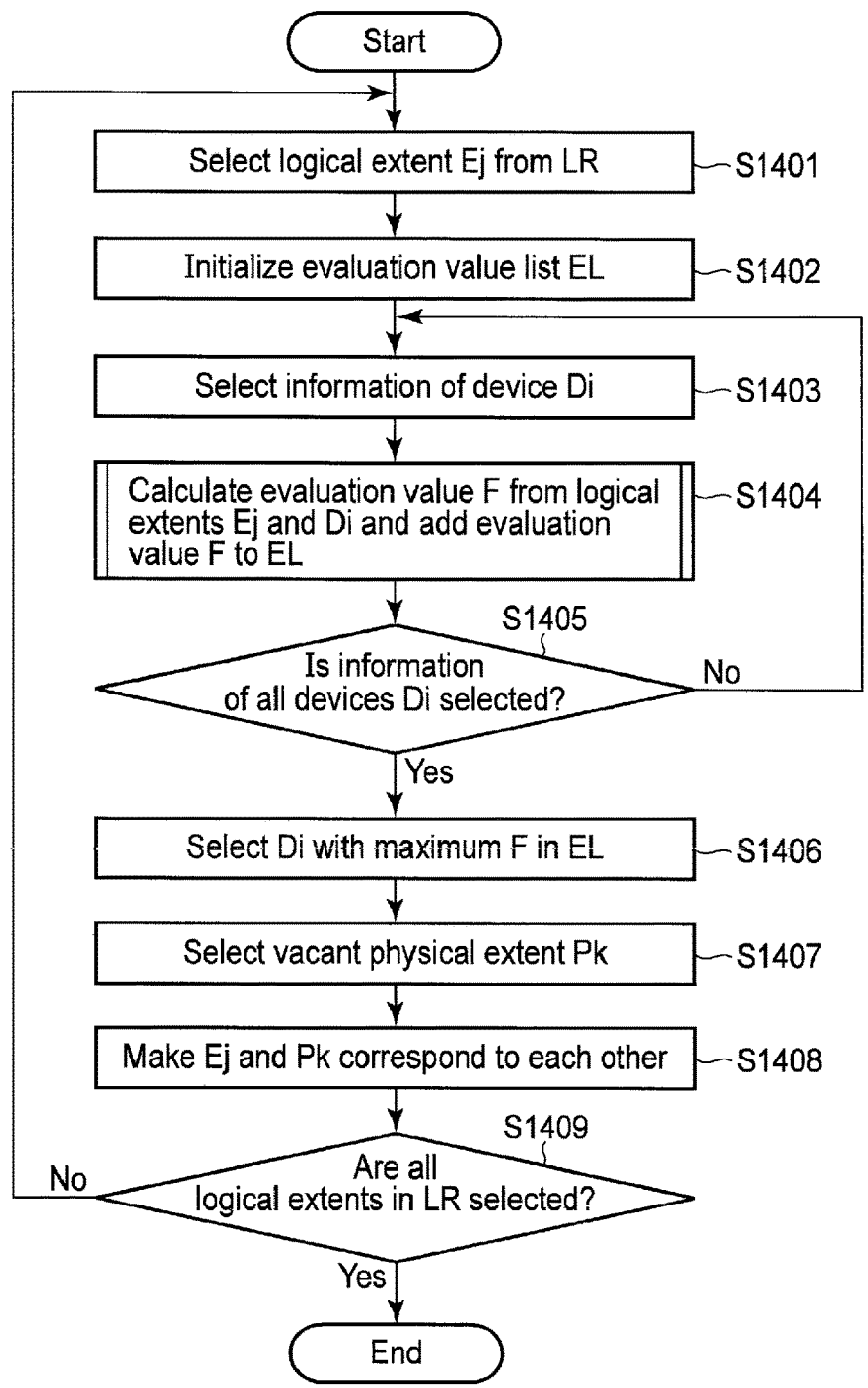
F I G. 14

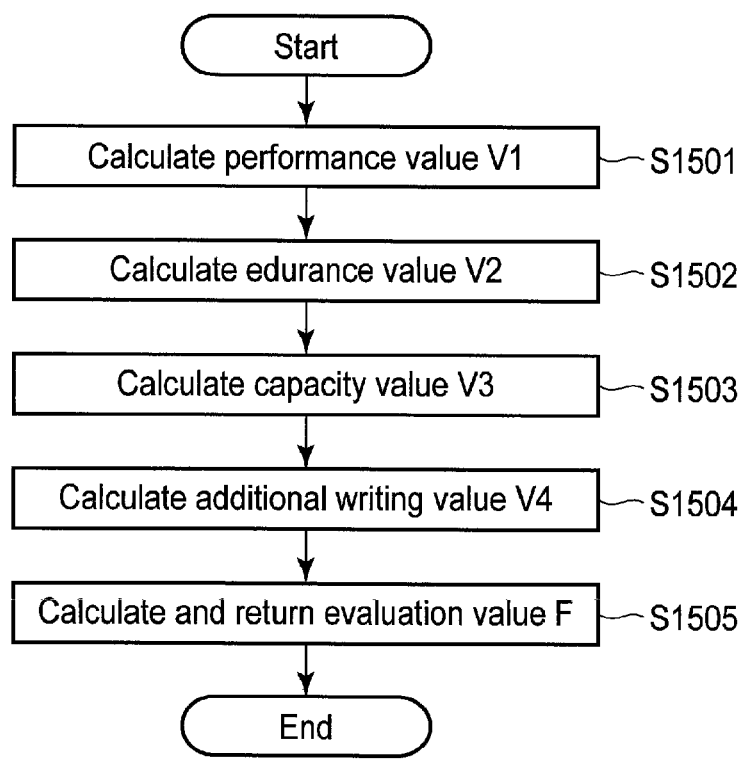
F I G. 15

6 Device specific information table

| Device ID | Maximum capacity (MB) | Logical capacity (MB) | Current used capacity (MB) | Remaining write amount (MB) | Guaranteed write amount (MB/day) | Read amount (MB) | Update amount (MB) | Additionally written amount (MB) | Performance specifications (IOPS) | Maximum load (IOPS) |
|---|---|---|---|---|---|---|---|---|---|---|
| D1 | 10 | 7 | 5 | 4000 | 10 | 12 | 12 | 1 | 40000 | 3200 |
| D2 | 10 | 5 | 4 | 5000 | 10 | 10 | 10 | 1 | 40000 | 1000 |
| D3 | 10 | 5 | 1 | 4500 | 10 | 1 | 0 | 0 | 30000 | 0 |

F I G. 16

8 Logical extent information table

| Logical extent ID | Logical disk ID | Head logical address | Belonging device ID | Physical extent ID | Read amount (MB) | Write amount (MB) |
|---|---|---|---|---|---|---|
| E1 | 0 | 0 | $D_1$ | 0 | 19 | 2 |
| E2 | 0 | 2048 | $D_1$ | P1 | 2 | 8 |
| E3 | 0 | 4096 | $D_1$ | P2 | 0 | 2 |
| E4 | 0 | 6144 | $D_2$ | 0 | 0 | 1 |
| E5 | 0 | 8192 | NULL | NULL | 0 | 2 |

F I G. 17

9 Physical extent information table

| Physical extent ID | Belonging device ID | Head physical address | Vacancy information |
|---|---|---|---|
| P1 | $D_1$ | 0 | 0 |
| P2 | $D_1$ | 2048 | 0 |
| P3 | $D_2$ | 0 | 0 |
| P4 | $D_2$ | 2048 | 0 |
| P5 | $D_3$ | 0 | 0 |
| P6 | $D_3$ | 2048 | 0 |

F I G. 18

| Device ID | V1 | EW | AW | V2 | V3 | AR | V4 | F |
|---|---|---|---|---|---|---|---|---|
| $D_1$ | 0.23 | 8.888889 | 12 | -0.0875 | 0.035714 | 0.04 | 0.24 | 0.418214 |
| $D_2$ | 0.24375 | 11.11111 | 1 | 0.2275 | 0 | 0.047619 | 0.238095 | 0.709345 |
| $D_3$ | 0.25 | 10 | 0 | 0.25 | 0.15 | 0 | 0.25 | 0.9 |

F I G. 19

8 Logical extent information table

| Logical extent ID | Logical disk ID | Head logical address | Belonging device ID | Physical extent ID | Read amount (MB) | Write amount (MB) |
|---|---|---|---|---|---|---|
| E1 | 0 | 0 | $D_1$ | 0 | 19 | 2 |
| E2 | 0 | 2048 | $D_1$ | P1 | 2 | 8 |
| E3 | 0 | 4096 | $D_1$ | P2 | 0 | 2 |
| E4 | 0 | 6144 | $D_2$ | 0 | 0 | 1 |
| E5 | 0 | 8192 | $D_3$ | P6 | 0 | 2 |

F I G. 20

| Device ID | Guaranteed write amount (MB/day) | AW |
|---|---|---|
| $D_1$ | 10 | 12 |
| $D_2$ | 10 | 1 |
| $D_3$ | 10 | 0 |

FIG. 23

| Device ID | V1 | EW | AW | V2 | V3 | AR | V4 | F |
|---|---|---|---|---|---|---|---|---|
| $D_1$ | 0.23 | 8.888889 | 12 | -0.0875 | 0.035714 | 0.04 | 0.24 | 0.418214 |
| $D_2$ | 0.24375 | 11.11111 | 1 | 0.2275 | 0 | 0.047619 | 0.238095 | 0.709345 |
| $D_3$ | 0.25 | 10 | 0 | 0.25 | 0.15 | 0 | 0.25 | 0.9 |

FIG. 24

8 Logical extent information table

| Logical extent ID | Logical disk ID | Head logical address | Belonging device ID | Physical extent ID | Read amount (MB) | Write amount (MB) |
|---|---|---|---|---|---|---|
| E1 | 0 | 0 | $D_1$ | 0 | 19 | 2 |
| E2 | 0 | 2048 | $D_3$ | P5 | 2 | 8 |
| E3 | 0 | 4096 | $D_1$ | P2 | 0 | 2 |
| E4 | 0 | 6144 | $D_2$ | 0 | 0 | 1 |
| E5 | 0 | 8192 | NULL | NULL | 0 | 2 |

FIG. 25

6 Device specific information table

| Device ID | Maximum capacity (MB) | Logical capacity (MB) | Current used capacity (MB) | Remaining write amount (MB) | Guaranteed write amount (MB/day) | Read amount (MB) | Update amount (MB) | Additionally written amount (MB) | Performance specifications (IOPS) | Maximum load (IOPS) |
|---|---|---|---|---|---|---|---|---|---|---|
| $D_1$ | 10 | 10 | 4 | 4000 | 10 | 12 | 12 | 1 | 40000 | 3200 |
| $D_2$ | 10 | 10 | 4 | 5000 | 10 | 10 | 10 | 1 | 40000 | 1000 |
| $D_3$ | 10 | 10 | 2 | 4499 | 10 | 1 | 1 | 0 | 30000 | 0 |

F I G. 26

| Device ID | V1 | EW | AW | V2 | V3 | AR | V4 | F | C | V | Logical capacity before calculation (MB) | Logical capacity after calculation (MB) | Difference |
|---|---|---|---|---|---|---|---|---|---|---|---|---|---|
| D1 | 0.23 | 8.888889 | 12 | -0.0875 | 0.125 | 0.04 | 0.01 | 0.2775 | 5 | 2.3875 | 7 | 7.3875 | 0.3875 |
| D2 | 0.24375 | 11.11111 | 1 | 0.2275 | 0.15 | 0.047619 | 0.011905 | 0.633155 | 6 | 4.798929 | 5 | 8.798928571 | 3.798929 |
| D3 | 0.25 | 10 | 0 | 0.25 | 0.225 | 0 | 0 | 0.725 | 9 | 6.525 | 5 | 7.525 | 2.525 |

F I G. 27

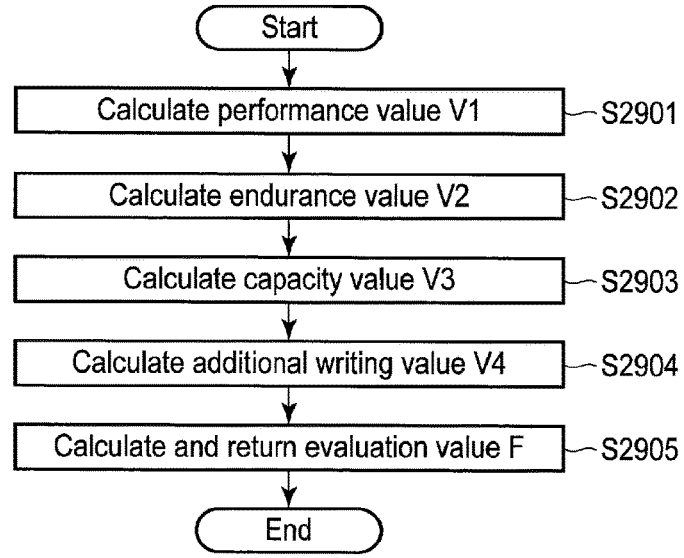
F I G. 29
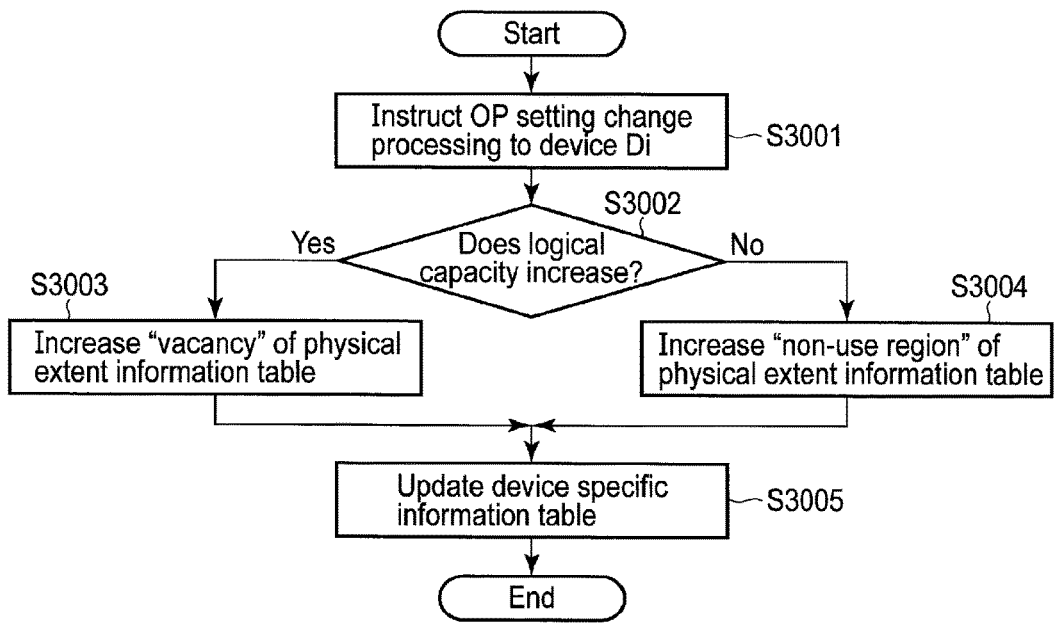
F I G. 30

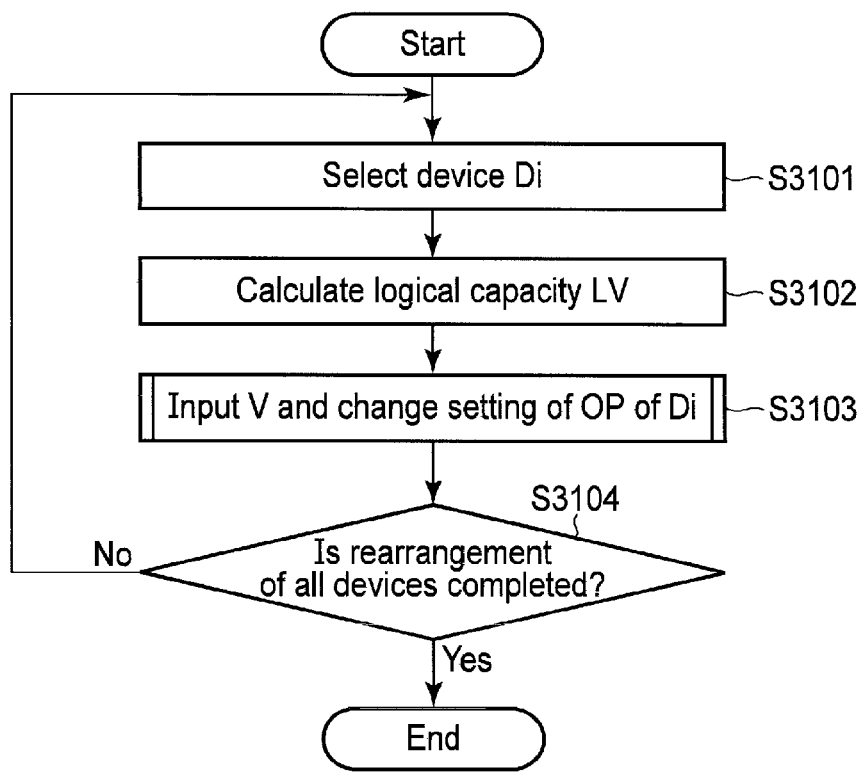
F I G. 31

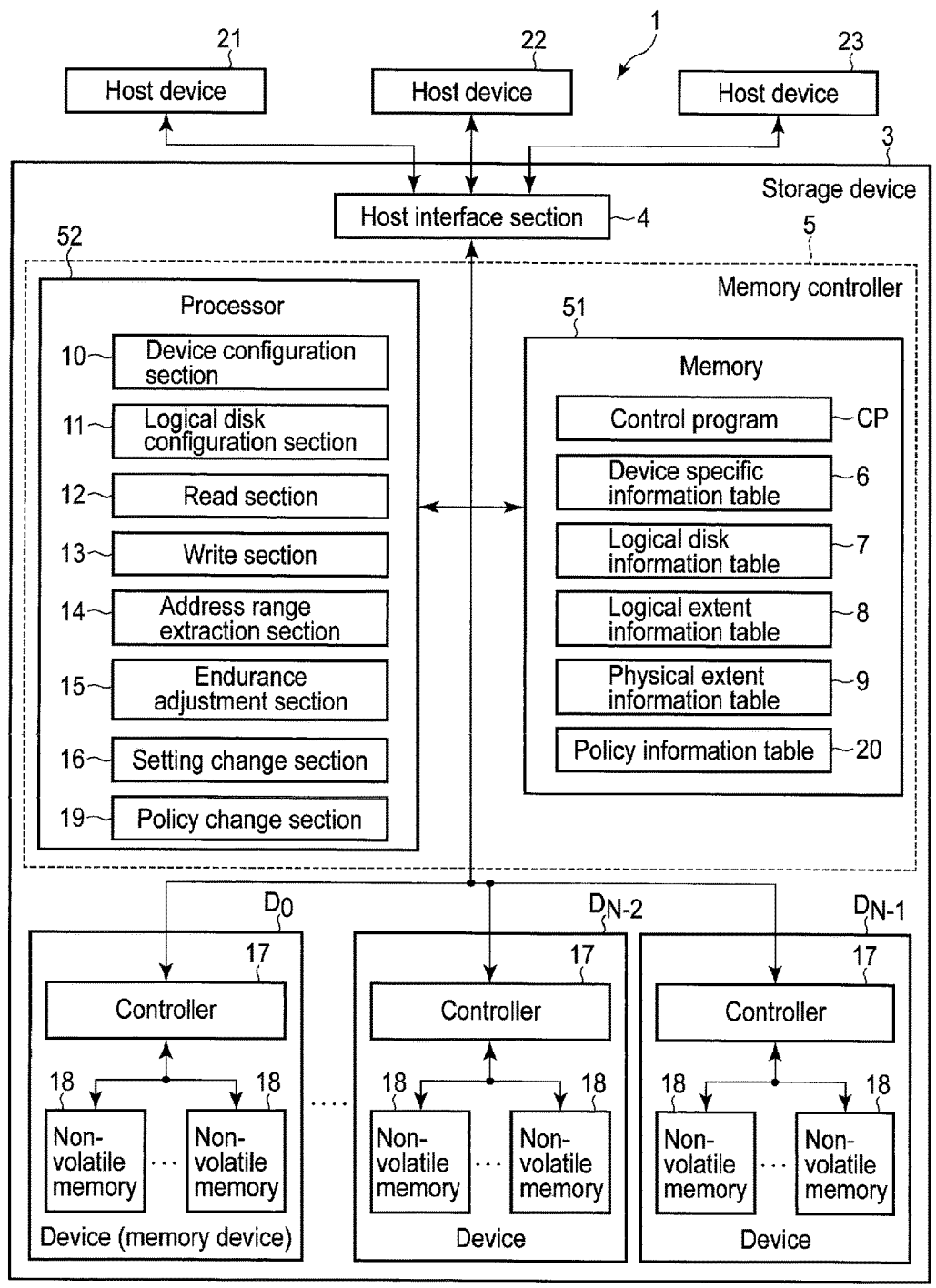
F I G. 32

20 Policy information table

| Coefficient | Value |
|---|---|
| W1 | 0.1 |
| W2 | 0.4 |
| W3 | 0.3 |
| W4 | 0.2 |

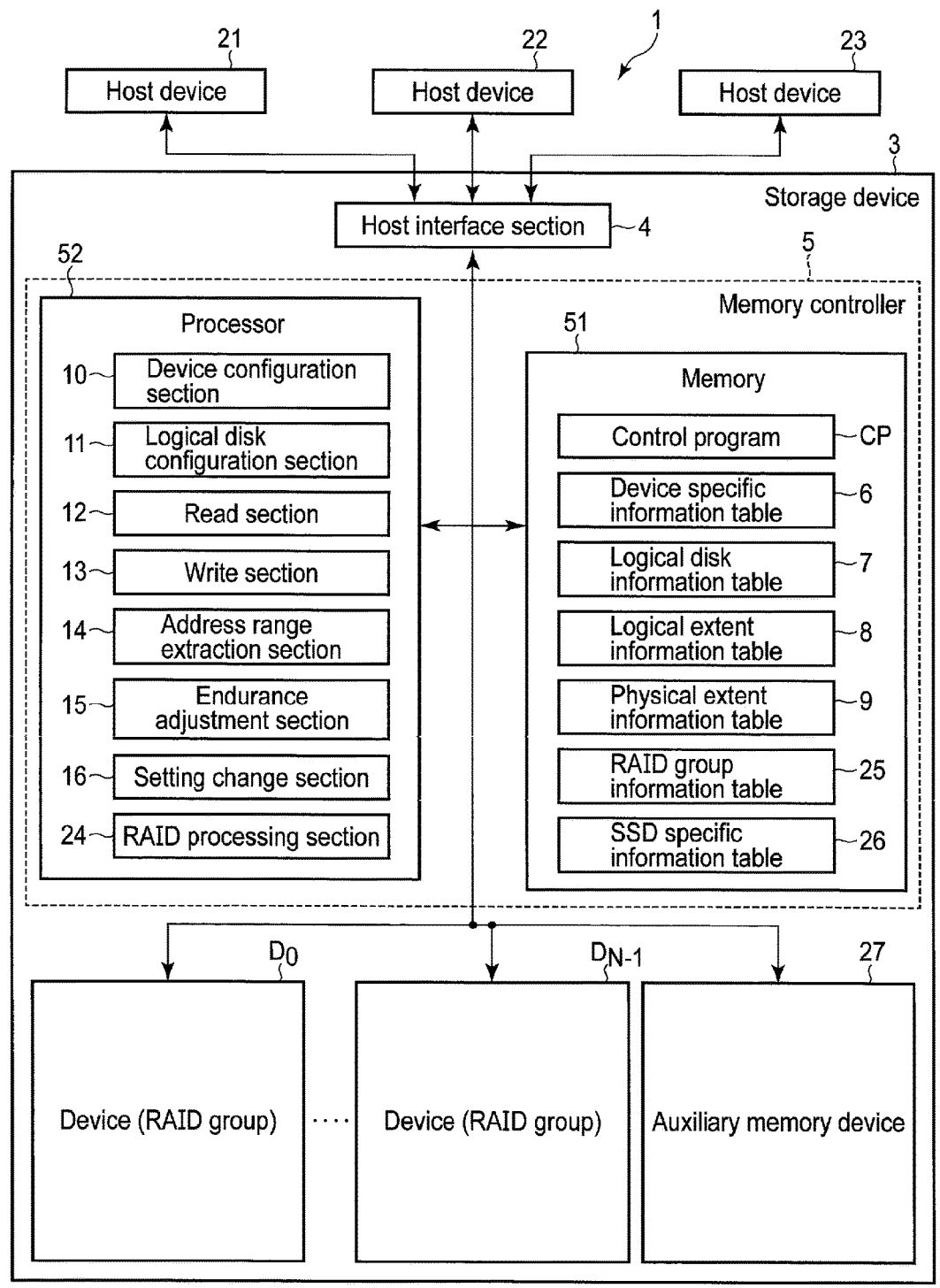
F I G. 35

25 RAID group information table

| Device ID | RAID level | Belonging SSD ID |
|---|---|---|
| $D_0$ | 1 | 1,2,3,4 |
| $D_1$ | 1 | 5,6,7,8 |
| ... | ... | ... |
| $D_{N-1}$ | 1 | 37,38,39,40 |

F I G. 36

26 SSD specific information table

| SSD device ID | Maximum capacity (MB) | Logical capacity (MB) | Current used capacity (MB) | Remaining write amount (MB) | Guaranteed write amount (MB/day) |
|---|---|---|---|---|---|
| 0 | 102400.0 | 20000.0 | 20000.0 | 102400 | 4000000.0 |
| 1 | 102400.0 | 40000.0 | 30000.0 | 51200 | 5000000.0 |
| ... | ... | ... | ... | ... | ... |
| 10 | 102400.0 | 80000.0 | 40000.0 | 4500000.0 | 20480 |

F I G. 37

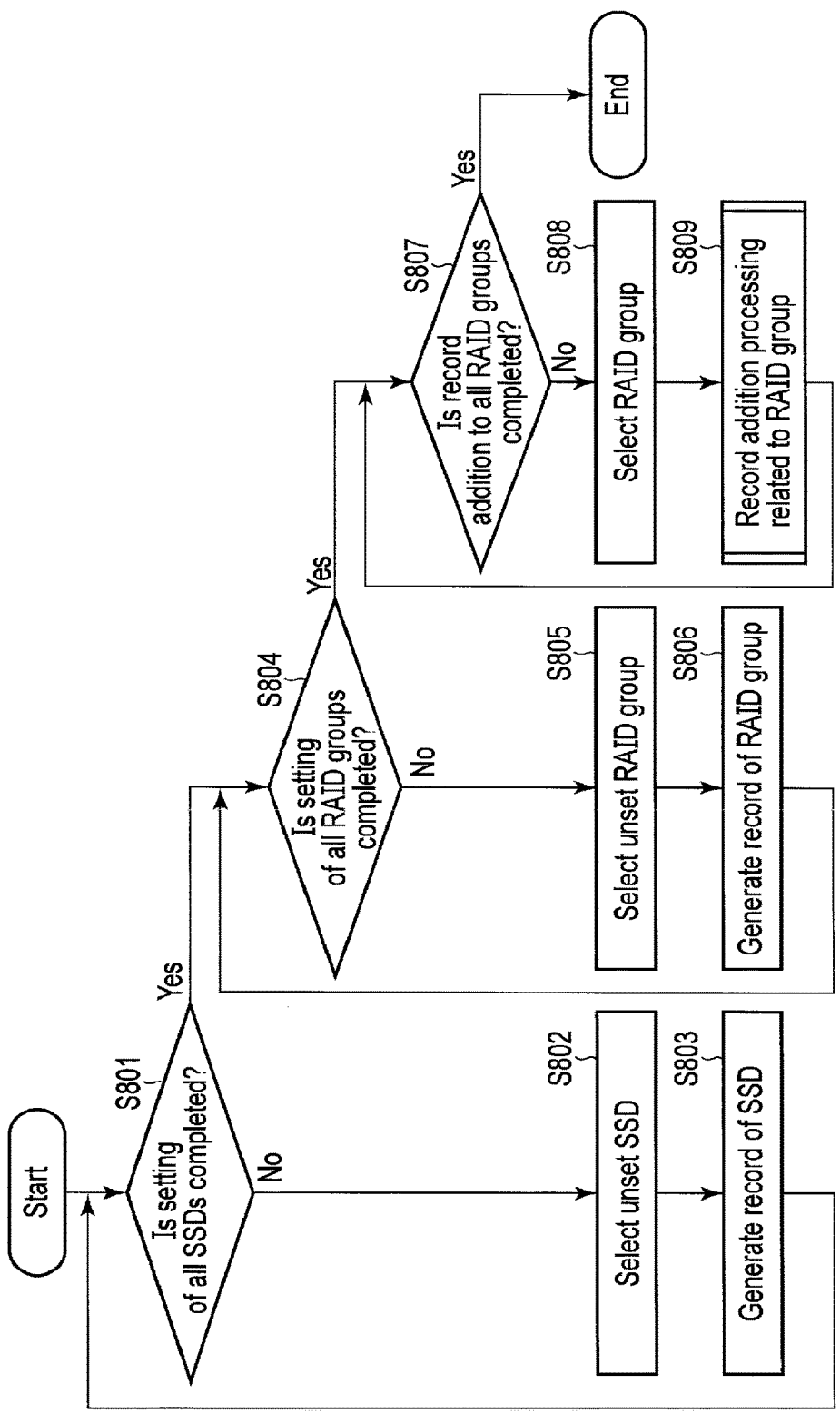
F I G. 38

MEMORY CONTROLLER AND STORAGE DEVICE WHICH SELECTS MEMORY DEVICES IN WHICH DATA IS TO BE WRITTEN BASED ON EVALUATION VALUES OF A USABLE CAPACITY OF THE MEMORY DEVICES

CROSS-REFERENCE TO RELATED APPLICATIONS

This application is based upon and claims the benefit of priority from Japanese Patent Application No. 2016-046934, filed Mar. 10, 2016, the entire contents of which are incorporated herein by reference.

FIELD

Embodiments described herein relate generally to a memory controller for increasing an endurance of a memory, a storage device, and a method of controlling a storage device.

BACKGROUND

One example of a technique for increasing an endurance of a flash memory includes over-provisioning. The over-provisioning is, for example, a technique for limiting a logical capacity of SSD (Solid State Drive) to secure a specified region of a physical capacity of SSD as a non-usable region, and thus to increase a usable amount of data.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 1 is a block diagram showing one example of a storage device including a memory controller according to a first embodiment.

FIG. 2 is a conceptual diagram showing one example of a disk structure of the storage device according to the first embodiment.

FIG. 3 is a data structure diagram showing one example of a device specific information table according to the first embodiment.

FIG. 4 is a data structure diagram showing one example of a logical disk information table according to the first embodiment.

FIG. 5 is a data structure diagram showing one example of a logical extent information table according to the first embodiment.

FIG. 6 is a data structure diagram showing one example of a physical extent information table 9 according to the first embodiment.

FIG. 7 is a flowchart showing one example of processing in a device configuration section according to the first embodiment.

FIG. 10 is a flowchart showing one example of a record addition processing related to a logical disk and executed by the logical disk configuration section according to the first embodiment.

FIG. 11 is a flowchart showing one example of processing in a read section according to the first embodiment.

FIG. 13 is a flowchart showing one example of processing in a write section according to the first embodiment.

FIG. 14 is a flowchart showing one example of an allocation write destination selection processing in an endurance adjustment section according to the first embodiment.

FIG. 15 is a flowchart showing one example of a allocation write destination evaluation processing in the endurance adjustment section according to the first embodiment.

FIG. 16 is a data structure diagram showing one example of the device specific information table.

FIG. 17 is a data structure diagram showing one example of the logical extent information table.

FIG. 18 is a data structure diagram showing one example of the physical extent information table.

FIG. 19 is a view showing one example of a relationship between devices and evaluation values.

FIG. 20 is a data structure diagram showing one example of the logical extent information table after update.

FIG. 23 is a view exemplifying an accumulated write amount for each of device IDs.

FIG. 24 is a view exemplifying an evaluation value for each of the device IDs.

FIG. 25 is a data structure diagram showing one example of the logical extent information table after rearrangement.

FIG. 26 is a data structure diagram showing one example of the device specific information table after rearrangement.

FIG. 27 is a view showing an example of evaluation results obtained by a setting evaluation processing for over-provisioning.

FIG. 29 is a flowchart showing one example of a rearrangement destination evaluation processing in the endurance adjustment section 15 according to the first embodiment.

FIG. 30 is a flowchart showing one example of a setting change processing for over-provisioning executed by a setting change section according to the first embodiment.

FIG. 31 is a flowchart showing one example of a setting evaluation processing for over-provisioning executed by the setting change section according to the first embodiment.

FIG. 32 is a block diagram showing one example of a storage device including a memory controller according to a second embodiment.

FIG. 35 is a block diagram showing one example of a storage device including a memory controller according to a third embodiment.

FIG. 36 is a data structure diagram showing one example of a RAID group information table according to the third embodiment.

FIG. 37 is a data structure diagram showing one example of a SSD specific information table according to the third embodiment.

FIG. 38 is a flowchart showing one example of processing in a RAID processing section according to the third embodiment.

DETAILED DESCRIPTION

Figure 8:
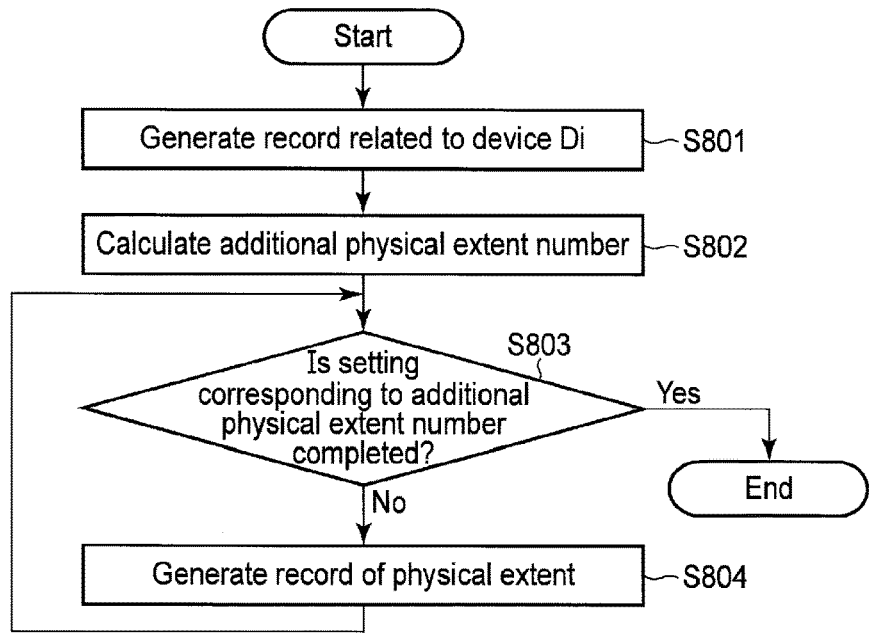
FIG. 8 is a flowchart showing one example of a record addition processing in the device configuration section according to the first embodiment.

Various embodiments will be described hereinafter with reference to the accompanying drawings.

In general, according to one embodiment, a memory controller includes a memory, an adjustment part, a writing part and a setting change part. The memory stores first data, that manages a write amount with respect to each of a plurality of regions where a plurality of nonvolatile memories are classified by a predetermined size, and second data that manages a write state corresponding to the plurality of nonvolatile memories. The adjustment part calculates, in writing of data to be written in the plurality of nonvolatile memories, a first evaluation value to each of the plurality of nonvolatile memories, based on the first data and the second data stored in the memory and selects the nonvolatile memory in which the data to be written is to be written, based on the first evaluation value. The write part writes the data to be written in the nonvolatile memory selected by the adjustment part and updates the first data and the second data stored in the memory. The setting change part calculates a second evaluation value to each of the plurality of nonvolatile memories, based on the first data and the second data stored in the memory after starting to use the plurality of nonvolatile memories and changes setting of a usable capacity with respect to at least one of the plurality of nonvolatile memories, based on the second evaluation value.

Hereinafter, embodiments will be described with reference to the drawings. Note that the same reference numerals denote the same or nearly the same components throughout the accompanying drawings, a description thereof will be omitted or briefly given, and only differences will be described in detail.

First Embodiment

In the present embodiment, a memory controller which changes setting of over-provisioning to increase an endurance of a memory will be described.

Hereinafter, identification information is denoted by ID.

In this embodiment, a memory device is referred to as a device.

In this embodiment, a reduction in imbalance of endurance, performance, load, and capacity among a plurality of devices included in a storage device is referred to as an equalization of endurance, performance, load, and capacity.

In this embodiment, the device can change setting of over-provisioning after activation of the device. Processing for changing setting of over-provisioning and thereby increasing the endurance of the device is referred to as endurance adjustment processing.

In this embodiment, access includes both data reading and data writing.

In this embodiment, the device and ID of the device are denoted by the same reference numeral. Extent and ID of the extent are denoted by the same reference numeral.

FIG. 1 is a block diagram showing one example of a storage device including a memory controller according to this embodiment.

A storage system 1 includes host devices 21 to 23 and a storage device 3. In the example of FIG. 1, a case where the storage device 3 can communicate with the three host devices 21 to 23 is exemplified. However, the storage device 3 may be communicable with one, two, or four or more host devices.

The host devices 21 to 23 transmit a write command, a write destination address, and write data to the storage device 3. Further, the host devices 21 to 23 transmit a read command and a read destination address to the storage device 3 and receives read data from the storage device 3.

The storage device 3 includes a host interface section 4, a memory controller 5, and devices $D_0$ to $D_{N-1}$. In the example of FIG. 1, although there is exemplified the case where N (N is a natural number) devices are provided, one or more devices may be provided. In this embodiment, each of the devices $D_0$ to $D_{N-1}$ is denoted by a device Di. i is 0, 1, . . . , and N−1.

For example, the host interface section 4, the memory controller 5, and the devices $D_0$ to $D_{N-1}$ can mutually transmit and receive data, addresses, commands, information, signals, instructions, and so on.

The host interface section 4 accepts access from the host devices 21 to 23.

The memory controller 5 includes a memory 51 and a processor 52.

The memory 51 may function as a main storage device, for example. The memory 51 may include a buffer memory, a cash memory, or a nonvolatile memory. As the memory 51, dynamic random access memory (DRAM) is used, for example.

The memory 51 stores a control program CP and various data, for example. The control program CP may be an operating system, an application program, a firmware, or the like, for example. For example, the memory 51 stores, as various data, a device specific information table 6, a logical disk information table 7, a logical extent information table 8, and a physical extent information table 9.

The processor 52 accesses the memory 51, executes various processing, executes access control with respect to the devices $D_0$ to $D_{N-1}$, and changes setting of over-provisioning.

The processor 52, for example, executes the control program CP stored in the memory 51 to function as a device configuration section 10, a logical disk configuration section 11, a read section 12, a write section 13, an address range extraction section 14, an endurance adjustment section 15, and an over-provisioning setting change section 16.

The devices $D_0$ to $D_{N-1}$ each include a controller 17 and one or more nonvolatile memories 18.

The controller 17 writes or reads data in or from the nonvolatile memory 18 in accordance with a command from the processor 52.

In this memory, a case where the nonvolatile memory 18 includes a NAND-type flash memory will be described. However, the nonvolatile memory 18 may not include the NAND-type flash memory, but may include another type of memory such as a NOR-type flash memory, magnetoresistive random access memory (MRAM), phase change random access memory (PRAM), resistive random access memory (ReRAM), or ferroelectric random access memory (FeRAM). The nonvolatile memory 18 may include a flash memory having a three-dimensional structure.

The devices $D_0$ to $D_{N-1}$ can change setting of over-provisioning even after operation of the devices $D_0$ to $D_{N-1}$. In this embodiment, the devices $D_0$ to $D_{N-1}$ are semiconductor storage devices, for example. More specifically, the devices $D_0$ to $D_{N-1}$ are SSDs, for example. However, the device may be a hybrid-type device in which SSD and HDD are combined, for example.

The devices $D_0$ to $D_{N-2}$ are devices for data storage. The device $D_{N-1}$ is a preliminary device for hot spare.

The device configuration section 10, the logical disk configuration section 11, the read section 12, the write section 13, the address range extraction section 14, the endurance adjustment section 15, and the over-provisioning setting change section 16 will be specifically described later.

FIG. 2 is a conceptual diagram showing one example of a disk structure of the storage device 3 according to this embodiment.

The storage device 3 provides, as logical disks $LD_0$ to $LD_{N-1}$, storage regions of the devices $D_0$ to $D_{N-1}$ in the storage device 3 to the host devices 21 to 23. In FIG. 2, although an example in which N logical disks are used is described, the number of the logical disks may be one or more. A logical disk ID for identification is assigned to each of the logical disks $LD_0$ to $LD_{N-1}$. Each of the logical disks $LD_0$ to $LD_{N-1}$ is divided into sectors, and a logical block address (logical address) is assigned to each sector. The host devices 21 to 23 access to the sector in each of the logical disks $LD_0$ to $LD_{N-1}$ with the use of the logical address.

The logical address is in a one-to-one relationship to the number (physical address) of each sector storing data of the devices $D_0$ to $D_{N-1}$ of the storage device 3. The size of the sector corresponding to the physical address and the logical address is constant and may be 512 Byte, for example.

The storage regions in the logical disks $LD_0$ to $LD_{N-1}$ are managed in a unit called a logical extent of a fixed length. The size of the logical extent (extent size) is constant in the storage device 3 and may be 8 MByte, for example. The logical extent is treated as a processing unit in endurance adjustment processing.

In FIG. 2, the logical disks $LD_0$ to $LD_{N-1}$ include logical extents le1 to le9. The devices $D_0$ to $D_{N-1}$ include physical extents pe1 to pe9.

The logical extent le1 of the logical disk $LD_0$ corresponds to the physical extent pe2 of the device $D_0$. The logical extent le2 of the logical disk $LD_0$ corresponds to the physical extent pe9 of the device $D_0$. The logical extent le3 of the logical disk $LD_0$ corresponds to the physical extent pe2 of the device $D_{N-1}$. The logical extent le9 of the logical disk $LD_0$ does not correspond to any physical extent.

In the storage device 3, the logical extent and the physical extent are in a one-to-one relationship, and each logical address in the logical extent is in a one-to-one relationship to the physical address in the physical extent corresponding to the logical extent.

Here, the outline of data reading and data writing in the storage device 3 will be described. First, the host devices 21 to 23 transmit logical disk IDs and the logical addresses to the storage device 3. Next, the storage device 3 converts the logical disk IDs and the logical addresses into physical addresses of the devices $D_0$ to $D_{N-1}$, reads out data corresponding to the physical addresses or writes data in the storage region corresponding to the physical address. Then, the storage device 3 transmits a response to the host devices 21 to 23 and terminates processing. The address conversion is performed with reference to the logical extent information table 8 to be described later.

In this embodiment, processing for setting over-provisioning suitable for a workload with respect to each of the devices $D_0$ to $D_{N-1}$ in the storage device 3 will be described.

Hereinafter, the function of the storage device 3 exemplified in FIG. 1 will be described in detail.

The device configuration section 10 performs setting when the device is added to the storage device 3 or replaced. The device configuration section 10 performs record addition processing related to the device, for example.

The logical disk configuration section 11 performs setting when a logical disk is added. The logical disk configuration section 11 performs record addition processing related to the logical disk, for example.

The read section 12 performs target address extraction processing, read processing, and table update processing.

The write section 13 performs target address extraction processing, write processing, and table update processing.

The address range extraction section 14 extracts a target to be read or written.

The endurance adjustment section 15 performs endurance adjustment processing for the devices $D_0$ to $D_{N-1}$, rearrangement destination selection processing, rearrangement processing, rearrangement destination evaluation processing, allocation write destination selection processing, and allocation write destination evaluation processing.

The setting change section 16 performs setting change processing and setting evaluation processing for over-provisioning.

The device specific information table 6 manages the logical capacities of the devices $D_0$ to $D_{N-1}$ of the storage device 3.

The logical disk information table 7 manages the logical capacities of the logical disks $LD_0$ to $LD_{N-1}$.

The logical extent information table 8 manages a correspondence relationship between address information of the logical extent and the physical extent.

The physical extent information table 9 manages information of the physical extent.

In each drawing of this embodiment, Mbyte is denoted by MB.

FIG. 3 is a data structure diagram showing one example of the device specific information table 6 according to this embodiment.

The device specific information table 6 is information for managing the used capacity and write capacity of the device Di. One entry of FIG. 3 corresponds to one device. Information of all the devices Di including the device for hot spare in the storage device 3 is entered into the device specific information table 6.

Each entry of the device specific information table 6 includes a device ID of each device Di, a maximum capacity, a logical capacity, a current used capacity, a remaining write amount, a guaranteed write amount, a read amount, an update amount, an additionally written amount, performance specifications, and a maximum load.

The device ID is ID for uniquely identifying the device Di, and SCSI (Small Computer System Interface) ID of a corresponding device may be used, for example.

The maximum capacity represents a maximum value of the capacity that can be used by the host devices 21 to 23.

The logical capacity is a capacity that can be used by the host devices 21 to 23 and is different from the maximum capacity.

The current used amount is included in the logical capacity and corresponds to a capacity actually used by the host devices 21 to 23.

The remaining write amount is a value obtained by subtracting a total of a write amount from start of use of the device Di from a total write amount guaranteed by a vendor of the device Di. The memory controller 5 performs setting of over-provisioning suitable for the device Di, based on a value of the remaining write amount.

The guaranteed write amount is a write amount per unit time guaranteed by a vendor. If writing is executed within a pace following the guaranteed write amount, it is guaranteed that the device Di does not come to the end of its endurance until a guaranteed period of a vendor passes. In this embodiment, a unit time may be a day, for example.

The read amount is an accumulated value of data amount read per unit time with respect to the device Di.

The update amount is an accumulated value of data amount updated per unit time with respect to the device Di.

The additionally written amount is an accumulated value of data amount subjected to allocation writing per unit time with respect to the device Di.

The allocation writing indicates writing in the logical extent not assigned to the physical extent.

The performance specifications are specifications of a maximum performance of the device Di. As a performance index, IOPS (Input/Output Per Second), a response time (unit: millisecond), throughput (unit: MB/sec), or the like may be used. In this embodiment, as one example of the performance index, IOPS is used.

The maximum load is a maximum value of the performance index recorded during the unit time with respect to the device Di. In other words, the maximum load represents the maximum performance of the device Di recorded during the unit time.

In the setting of over-provisioning in this embodiment, the logical capacity can be set to the device Di to have a value not more than the maximum capacity.

When a new device is added, the device configuration section 10 performs initialization of each attribute in the device specific information table 6.

Here, initialization and update of each attribute in the device specific information table 6 by the device configuration section 10 will be described. The update of the device specific information table 6 is suitably changed according to the type of the device Di.

The device configuration section 10 sets, as the device ID, the maximum capacity, the guaranteed write amount, and the performance specifications, a fixed value to the device specific information table 6.

The device configuration section 10 initializes the logical capacity and an upper limit of the write amount, and the endurance adjustment section 15 updates the logical capacity.

The device configuration section 10 initializes the current used capacity, the remaining write amount, the update amount, and the additionally written amount, and the write section 13 updates the current used capacity, the remaining write amount, the update amount, and the additionally written amount. The device configuration section 10 resets the update amount and the additionally written amount after elapse of the unit time.

The device configuration section 10 initializes the read amount, and the read section 12 updates the read amount. The device configuration section 10 resets the read amount after elapse of the unit time.

The device configuration section 10 continues to record the maximum load during the unit time. The device configuration section 10 resets the maximum load after elapse of the unit time.

FIG. 4 is a data structure diagram showing one example of the logical disk information table 7 according to this embodiment.

The logical disk information table 7 is information for managing the logical capacities of the logical disks $LD_0$ to $LD_{N-1}$. One entry of FIG. 4 corresponds to one logical disk. Information of all the logical disks $LD_0$ to $LD_{N-1}$ in the storage device 3 is entered into the logical disk information table 7.

Each entry of the logical disk information table 7 includes the logical disk ID and the logical capacity.

The logical disk ID is ID for uniquely identifying the logical disk.

The logical capacity represents the logical capacity set in the logical disk.

The logical disk configuration section 11 initializes and updates the logical disk information table 7.

FIG. 5 is a data structure diagram showing one example of the logical extent information table 8 according to this embodiment.

The logical extent information table 8 is information for managing a correspondence relationship among address information showing a position where the logical extent is stored, logical extent ID, and physical extent ID. One entry of FIG. 5 corresponds to one logical extent. Each entry of the logical extent information table 8 includes the logical extent ID of each logical extent, the logical disk ID, a head logical address, a belonging device ID, the physical extent ID, the read amount, and the write amount. All logical extents in the storage device 3 are entered into the logical extent information table 8.

The logical extent ID is identification information for uniquely identifying the logical extent in the logical disk.

The logical disk ID is ID for identifying the logical disk including the logical extent.

The head logical address is a head logical address of a logical address region in which the logical extent is managed in the logical disk.

The belonging device ID is ID for identifying a device including the physical extent corresponding to the logical extent.

The physical extent ID is ID for identifying the physical extent corresponding to the logical extent.

The read amount is an accumulated value of data amount read per unit time with respect to the logical extent.

The write amount is an accumulated value of data amount updated per unit time with respect to the logical extent.

The device configuration section 10 initializes the logical extent ID, the logical disk ID, and the head logical address and does not update.

The write section 13 initializes a pair of the belonging device ID of each logical extent and the physical extent ID. The endurance adjustment section 15 updates the pair of the belonging device ID corresponding to each logical extent and the physical extent ID, based on rearrangement processing.

The logical disk configuration section 11 initializes the read amount and the write amount such that these amounts become zero. The read section 12 updates the read amount. The logical disk configuration section 11 resets the read amount after elapse of the unit time. The write section 13 updates the write amount. The logical disk configuration section 11 resets the write amount after elapse of the unit time.

FIG. 6 is a data structure diagram showing one example of the physical extent information table 9 according to this embodiment.

The physical extent information table 9 is information for managing information of the physical extent. One entry of FIG. 6 corresponds to one physical extent. Each entry of the physical extent information table 9 includes the physical extent ID of each physical extent, the belonging device ID, a head physical address, and vacancy information. All physical extents in the storage device 3 are entered into the physical extent information table 9. The physical extent is defined with respect to all storage regions provided by the devices $D_0$ to $D_{N-1}$ of the storage device 3.

The physical extent ID is ID for uniquely identifying the physical extent in devices $MD_0$ to $MD_{N-1}$.

The belonging device ID is ID for identifying a device including the physical extent.

The head physical address is a head physical address of a physical address region in which the physical extent is managed.

The vacancy information is information showing a state of the physical extent. The vacancy information has the following values based on the address region in which the physical extent is managed.

When all address regions of the physical extent have been deleted, the vacancy information is 1 ("vacancy").

When data is stored in the address region of the physical extent, the vacancy information is 0 ("use").

When the address region of the physical extent is in a range not used by the host devices 21 to 23 due to over-provisioning, the vacancy information is NULL ("non-use region").

When a new device is added, the device configuration section 10 sets the physical extent information table 9.

The write section 13 adds a record to the physical extent ID, the belonging device ID, and the head physical address and sets an initial value with respect to the physical extent information table 9. The write section 13 does not update the physical extent ID, the belonging device ID, and the head physical address with respect to the physical extent information table 9. The write section 13 sets 1 as an initial value to the vacancy information and then performs update.

The memory controller 5 refers to the logical extent information table 8 and the physical extent information table 9 to obtain the physical address corresponding to the logical address. Conversion from the logical address to the physical address will be described later.

Hereinafter, various processing executed by the memory controller 5 will be described.

FIG. 7 is a flowchart showing one example of processing in the device configuration section 10 according to this embodiment.

When the device configuration section 10 receives a list of devices to be added to the storage device 3, the device configuration section 10 judges whether or not setting to all devices in the list is completed in step S701. The received list is denoted by DL.

When setting to all devices in the list DL is completed, processing is terminated.

When setting to all devices in the list DL has not been completed, the device configuration section 10 selects an unset device Di in step S702.

In step S703, the device configuration section 10 executes record addition processing related to the device Di. Then, the processing returns to step S701.

FIG. 8 is a flowchart showing one example of the record addition processing in the device configuration section 10 according to this embodiment.

In step S801, the device configuration section 10 newly generates a record related to the device Di in the device specific information table 6.

Specifically, the device configuration section 10 sets the device ID, the maximum capacity, the guaranteed write amount, and the performance specifications in accordance with the following method.

The device configuration section 10 sends a command to the device Di and sets the device ID, the maximum capacity, the guaranteed write amount, and the performance specifications in accordance with a response to the command from the device Di. The command is an INQUIRY command of SCSI, for example.

When the device Di does not treat such a command, the device configuration section 10 sets an initial value of the device Di to be added, which is manually set by a user, for example.

The device configuration section 10 refers to a table in which a set value is defined for each type of the device Di and thereby sets a set value of the device Di.

The device configuration section 10 sets an initial value of the logical capacity at 50% of the maximum capacity. However, the logical capacity may be set at other percentages than 50% with respect to the maximum capacity.

The device configuration section 10 initializes the current used capacity, the read amount, the update amount, the additionally written amount, and the maximum load with zero.

In step S802, the device configuration section 10 calculates an additional physical extent number with the maximum capacity of the device Di/an extent size.

In step S803, the device configuration section 10 judges whether or not addition of a record of the physical extent corresponding to the additional physical extent number is completed.

When setting of the physical extent corresponding to the additional physical extent number (record addition) is completed, processing is terminated.

When setting of the physical extent corresponding to the additional physical extent number has not been completed, in step S804, the device configuration section 10 newly generates a record of the physical extent in the physical extent information table 9.

Specifically, the device configuration section 10 sets, as the physical extent ID, a unique physical extent ID in the physical extent information table 9. The device configuration section 10 sets the device ID of the device Di as the belonging device ID. The device configuration section 10 sets, as the head physical address, the number of records already set to the device Di×the number of sectors corresponding to an extent size. The device configuration section 10 sets the vacancy information of the device Di to "vacancy".

When the device Di should fail during operation of the storage device 3, the device configuration section 10 deletes all logical extents and physical extents where the belonging device ID indicates the failed device Di.

Figure 9:
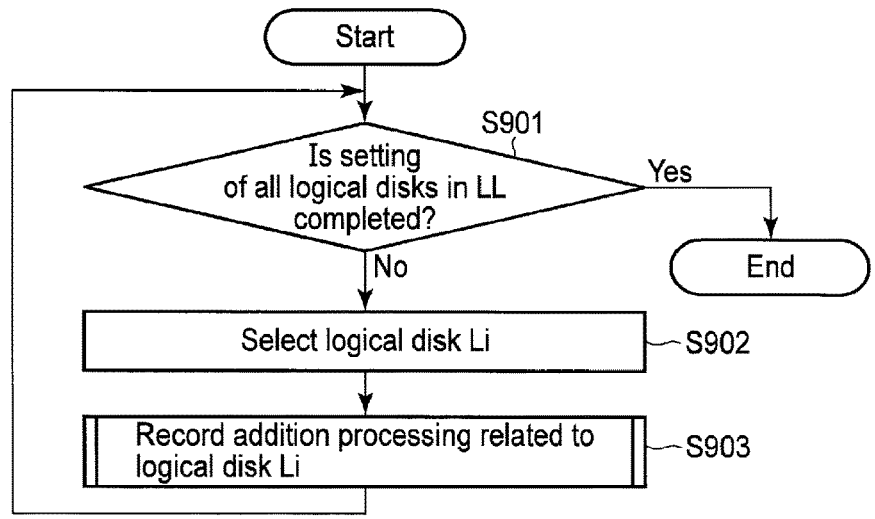
FIG. 9 is a flowchart showing one example of processing in a logical disk configuration section according to the first embodiment.

FIG. 9 is a flowchart showing one example of processing in the logical disk configuration section 11 according to this embodiment.

When the logical disk is set, the logical disk configuration section 11 updates the logical disk information table 7 and the logical extent information table 8. It is assumed that generation of the logical disk, assignment of the logical disk ID, imparting of the logical capacity, and setting of partitioning and the like have been performed manually, for example.

When the logical disk configuration section 11 receives a list of logical disks to be added, the logical disk configuration section 11 judges whether or not setting to all logical disks in the list is completed in step S901. The list of logical disks to be added is denoted by LL.

When setting to all logical disks in the list LL is completed, processing is terminated.

When setting to all logical disks in the list LL has not been completed, the logical disk configuration section 11 selects an unset logical disk in step S902. The selected logical disk is denoted by Li.

In step S903, the logical disk configuration section 11 executes record addition processing related to the logical disk Li. Then, the processing returns to step S901.

FIG. 10 is a flowchart showing one example of the record addition processing related to the logical disk Li and executed by the logical disk configuration section 11 according to this embodiment.

The logical disk ID of the logical disk Li and the logical capacity are input to the logical disk configuration section 11. The logical disk ID to be input is denoted by LID, and the logical capacity to be input is denoted by LV. Input values of the logical disk ID LID and the logical capacity LV are portions of configuration information referred to when the logical disk Li is set.

In step S1001, the logical disk configuration section 11 newly generates a record related to an unset logical disk Li in the logical disk information table 7 and sets the input logical disk ID LID and the input logical capacity LV in the record.

In step S1002, the logical disk configuration section 11 calculates an additional logical extent number with the input logical capacity LV of the logical disk Li/the extent size.

In step S1003, the logical disk configuration section 11 judges whether or not setting of all logical extents belonging to the logical disk Li is completed.

When setting of all logical extents belonging to the logical disk Li is completed, processing is terminated.

When setting of all logical extents belonging to the logical disk Li has not been completed, in step S1004, the logical disk configuration section 11 newly generates a record of the logical extent corresponding to the number of additional logical extent sizes in the logical extent information table 8. The logical disk configuration section 11 performs setting of the logical extent, corresponding to one record in the logical extent information table 8, by the following method.

The logical disk configuration section 11 sets, as the logical extent ID, a unique ID in the logical extent information table 8.

The logical disk configuration section 11 sets the input logical disk ID LID as the logical disk ID.

The logical disk configuration section 11 sets the head logical address of the logical extent according to the number of the logical extents starting from zero and belonging to the same logical disk ID in the logical extent information table 8×the number of addresses corresponding to the extent size.

The logical disk configuration section 11 sets the belonging device ID to NULL. A value of the belonging device ID is set by the write section 13 at data writing.

The logical disk configuration section 11 sets the physical extent ID to NULL. A value of the physical extent ID is set by the write section 13 at data writing.

The logical disk configuration section 11 sets the read amount and the write amount to zero.

FIG. 11 is a flowchart showing one example of processing in the read section 12 according to this embodiment. However, a portion of FIG. 11, more specifically step S1102 corresponds to processing in the address range extraction section 14.

Any of the host devices 21 to 23 transmits the logical disk ID LID, the logical address, and a read command, using data size as a parameter, to the storage device 3. The storage device 3 performs data reading based on the parameter and device information and returns read data to any of the host devices 21 to 23.

The read section 12 performs target address extraction processing, read processing, and table update processing.

In FIG. 11, steps S1101 to S1103 correspond to the target address extraction processing.

In step S1101, the read section 12 receives the logical disk ID LID of the logical disk as a read destination, the logical address, and the data size from any of the host devices 21 to 23. The received logical address is denoted by ADDR, and the data size is denoted by SIZE.

In step S1102, the address range extraction section 14 calculates a list of address ranges including a set of the logical extent ID of the logical extent to be read, the head address to be read in the logical extent to be read, and a size of data in the logical extent to be read, based on the received logical disk ID LID, the logical address ADDR, and the data size SIZE. The logical extent to be read is denoted by Ej, the head address to be read is denoted by Aj, the size is denoted by Sj, and the list of address ranges is denoted by LR.

In step S1103, the read section 12 secures a buffer memory, corresponding to the data size SIZE, in order to store read data.

In FIG. 11, steps S1104 to S1110 correspond to read processing and table update processing.

In step S1104, the read section 12 selects a set (Ej, Aj, Sj) of the logical extent ID Ej to be read, the head address Aj, and the size Sj from the list LR.

In step S1105, the read section 12 refers to the logical extent information table 8 and selects the physical extent ID to be read corresponding to the logical extent ID Ej to be read. The physical extent ID to be read is denoted by Pk.

In step S1106, the read section 12 reads data corresponding to from the head address Aj to the size Sj in the physical extent shown by the physical extent ID Pk and stores the data as read data in the buffer memory.

In step S1107, the read section 12 refers to the logical extent information table 8 and increases the read amount, corresponding to the logical extent ID Ej to be read, by the size Sj.

In step S1108, the read section 12 refers to the device specific information table 6 and increases the read amount, corresponding to the device ID indicating the device Di after data reading, by the size Sj.

In step S1109, the read section 12 judges whether or not all sets (Ej, Aj, Sj) of the logical extents ID Ej, the head address Aj, and the size Sj are selected from the list LR.

When all sets (Ej, Aj, Sj) are not selected from the list LR, processing moves to step S1104.

When all sets (Ej, Aj, Sj) are selected from the list LR, in step S1110, the read section 12 transmits read data in the buffer memory to any of the host devices 21 to 23 and terminates the processing. Data is denoted by DATA.

Figure 12:
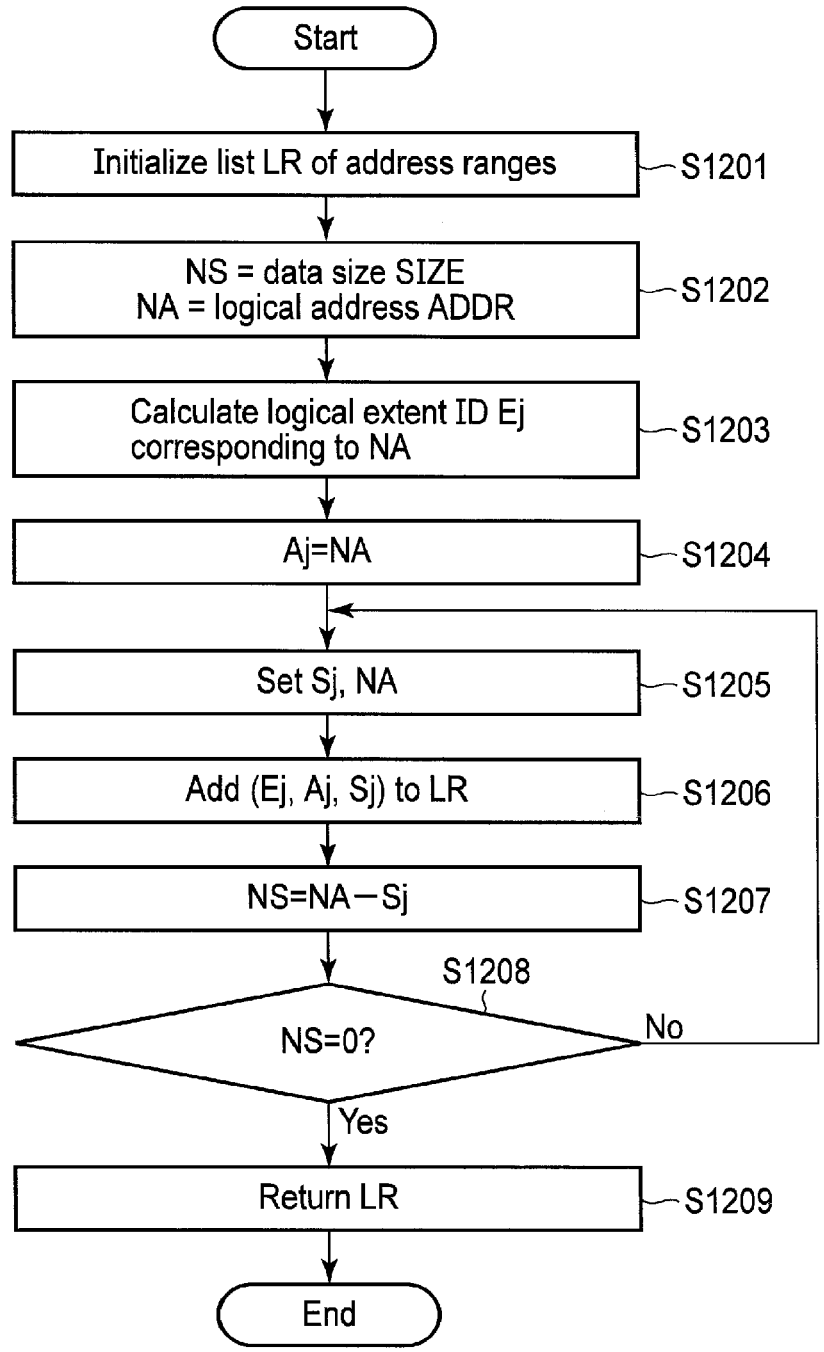
FIG. 12 is a flowchart showing one example of processing in a address range extraction section according to the first embodiment.

FIG. 12 is a flowchart showing one example of processing in the address range extraction section 14 according to this embodiment. The processing of FIG. 12 corresponds to step S1102 of FIG. 11.

The logical disk ID LID from which the address range is to be extracted, a target address ADDR, and the data size SIZE are input to the address range extraction section 14. The address range extraction section 14 outputs a list LR including the logical extent ID Ej, the head address Aj, and the size Sj.

In FIG. 12, steps S1201 and S1202 correspond to initialization processing.

In step S1201, the address range extraction section 14 initializes the list LR of address ranges as an empty list.

In step S1202, the address range extraction section 14 sets that a variable NS=SIZE and a variable NA=ADDR.

In FIG. 12, step S1203 and the subsequent steps correspond to processing for generating the list LR.

In step S1203, the address range extraction section 14 refers to the logical extent information table 8 and calculates, among the logical extents ID, the logical extent ID Ej satisfying the head logical address of the logical extent ID Ej≤NA<(the head logical address of Ej+the number of sectors corresponding to the extent size).

In step S1204, the address range extraction section 14 sets that the head address Aj=NA.

In step S1205, the address range extraction section 14 sets that a remaining size RS of the logical extent ID Ej=(an end logical address−ADDR) of Ej×the sector size. When RS>SIZE, the address range extraction section 14 sets that Sj=NS and NA=0. When RS>SIZE is negated, the address range extraction section 14 sets that Sj=RS, and NA=(the head logical address of Ej+the number of sectors corresponding to the extent size).

In step S1206, the address range extraction section 14 adds (Ej, Aj, Sj) to the list LR.

In step S1207, the address range extraction section 14 sets that NS=NA−Sj.

In step S1208, the address range extraction section 14 judges whether or not NS=0.

When NS=0 is negated, the processing transfers to step S1205.

When NS=0, in step S1209, the address range extraction section 14 returns the list LR to the read section 12 or the write section 13.

FIG. 13 is a flowchart showing one example of processing in the write section 13 according to this embodiment. Step S1302 of FIG. 13 corresponds to the processing in the address range extraction section 14 of FIG. 12, and step S1304 corresponds to the allocation write destination selection processing in the endurance adjustment section 15.

Any of the host devices 21 to 23 transmits the logical disk ID, the logical address, a data size, and a write command, using write data as a parameter, to the storage device 3. The storage device 3 performs data writing based on the parameter and device information.

In FIG. 13, steps S1301 to S1304 correspond to the target address extraction processing.

In step S1301, the write section 13 receives the logical disk ID LID of the logical disk as a write destination, the logical address ADDR, the data size SIZE, and write data DATA from any of the host devices 21 to 23. The write section 13 secures a buffer memory, corresponding to the data size SIZE, in order to store the write data DATA and stores the write data DATA in the buffer memory.

In step S1302, the address range extraction section 14 calculates the list LR of address ranges including a set (Ej, Aj, Sj) of the logical extent ID Ej of the logical extent to be written, the head address Aj to be written in the logical extent to be written, and the size Sj of data in the logical extent to be written, based on the received logical disk ID LID, the logical address ADDR, and the data size SIZE.

In step S1303, the write section 13 refers to the logical extent information table 8 and judges, among the logical extent IDs Ej in the list LR, whether or not there is the logical extent ID to which the belonging device ID is not set, that is, whether or not the logical extent ID and the physical extent ID should be newly made correspond to each other.

When the new correspondence is not required, the processing moves to step S1305.

When the new correspondence is required, in step S1304, the endurance adjustment section. 15 sets the physical extent ID in a one-to-one relationship with the logical extent ID, according to the allocation write destination selection processing.

In FIG. 13, steps S1305 to S1314 correspond to write processing and table update processing.

In step S1305, the write section 13 sets that OFFSET=0.

In step S1306, the write section 13 selects a set (Ej, Aj, Sj) of the logical extent ID Ej to be read, the head address Aj, and the size Sj from the list LR.

In step S1307, the write section 13 refers to the logical extent information table 8 and selects the physical extent ID Pk to be written corresponding to the logical extent ID Ej to be written.

In step S1308, the write section 13 writes data corresponding to the size Sj from a position of OFFSET of the buffer memory from the head address Aj to the size Sj, with respect to the physical extent indicated by the physical extent ID Pk to be written.

In step S1309, the write section 13 updates a reference position of the buffer memory, according to OFFSET=OFFSET+Sj.

In step S1310, the write section 13 refers to the logical extent information table 8 and increases a record write amount, corresponding to the logical extent ID Ej to be written, by the size Sj.

In step S1311, the write section 13 refers to the physical extent information table 9 and sets record vacancy information, corresponding to the logical extent ID Pk to be written, to "in use".

In step S1312, the write section 13 refers to the device specific information table 6 and reduces a remaining write amount of the device Di, subjected to data writing, by the size Sj. The write section 13 adds the extent size to the current used capacity and updates the current used capacity of the device Di. In the case of update writing, the write section 13 adds a data size of write data to the update amount, and in the case of allocation writing, the write section 13 adds the data size of write data to the additionally written amount. The update writing indicates writing in the logical extent assigned to the physical extent.

In step S1313, the write section 13 judges whether or not all sets (Ej, Aj, Sj) of the logical extents ID Ej, the head address Aj, and the size Sj in the list LR are selected.

When all sets (Ej, Aj, Sj) in the list LR are not selected, the processing moves to step S1306.

When all sets (Ej, Aj, Sj) in the list LR are selected, in step S1314, the write section 13 transmits a write completion notification to any of the host devices 21 to 23 and terminates the processing.

FIG. 14 is a flowchart showing one example of the allocation write destination selection processing in the endurance adjustment section 15 according to this embodiment. The allocation write destination selection processing of FIG. 14 corresponds to step S1304 of FIG. 13.

In the allocation write destination selection processing executed by the endurance adjustment section 15, the endurance and performance of the devices $D_0$ to $D_{N-1}$ are evaluated by the allocation write destination evaluation processing to be described later, and the device with the highest evaluation value is selected as a suitable allocation write destination.

In FIG. 14, step S1402 corresponds to initialization processing.

In step S1401, the endurance adjustment section 15 selects one of the logical extent IDs Ej from the list LR.

In step S1402, the endurance adjustment section 15 initializes an evaluation list EL as an empty list.

In FIG. 14, steps S1403 to S1406 correspond to allocation writing device determination processing.

In step S1403, the endurance adjustment section 15 refers to the device specific information table 6 and selects information of the device Di in the ascending order of the device ID.

In step S1404, the endurance adjustment section 15 calculates an evaluation value by the allocation write destination evaluation processing to be described later, based on the logical extent ID Ej and the information of the device Di. The calculated evaluation value is denoted by F. The endurance adjustment section 15 adds a pair of the information of the device Di and the evaluation value F to the list EL.

In step S1405, the endurance adjustment section 15 judges whether or not the information of all the devices Di is selected from the device specific information table 6.

When the information of all the devices Di is not selected from the device specific information table 6, the processing moves to step S1403.

When the information of all the devices Di is selected from the device specific information table 6, in step S1406, the endurance adjustment section 15 selects, from the list EL, the device ID of the device Di with the highest evaluation value F.

In FIG. 14, steps S1407 to S1409 correspond to correspondence processing between the logical extent ID and the physical extent ID.

In step S1407, the endurance adjustment section 15 selects one of the physical extent IDs Pk in the ascending order of ID from the physical extent IDs belonging to the device Di, indicated by the selected device ID, and corresponding to vacancy information "vacancy". The processing in step S1407 uses, as necessary information, each physical extent ID in the physical extent information table 9, the belonging device ID corresponding to the physical extent ID, and the vacancy information.

In step S1408, the endurance adjustment section 15 refers to the logical extent information table 8 and stores the device ID indicating the device Di and the physical extent IDs Pk in a record corresponding to the logical extent ID Ej to make the logical extent ID Ej correspond to the physical extent ID Pk.

In step S1409, the endurance adjustment section 15 judges whether or not all the logical extent IDs are selected from the list LR.

When all the logical extent IDs are not selected from the list LR, the processing moves to step S1401.

When all the logical extent IDs are selected from the list LR, the processing is terminated.

FIG. 15 is a flowchart showing one example of the allocation write destination evaluation processing in the endurance adjustment section 15 according to this embodiment. The allocation write destination evaluation processing of FIG. 15 corresponds to step S1404 of FIG. 14. In FIG. 15, the execution order of steps S1501 to S1504 can be freely changed, and these steps may be executed in parallel.

The endurance adjustment section 15 inputs the device information of the device Di, the logical extent ID Ej, weights W1 to W4 ($\Sigma Wi=1$, $\forall i$. $0 \le Wi$) and outputs the evaluation value F. For example, the weights W1 to W4 are values that can be set as policy information, included in parameters of the storage device 3, by a user. For example, initial values of the weights W1 to W4 may be each 0.25. For example, information on devices like the weights W1 to W4 or the logical extent may be stored in the device specific information table 6 or the logical extent information table 8.

In step S1501, the endurance adjustment section 15 calculates performance value V1=W1×(performance specifications of device Di−current IOPS of device Di)/performance specifications of device Di. For example, the current IOPS of the device Di is an IOPS value measured during execution of the allocation write destination evaluation processing.

In step S1502, the endurance adjustment section 15 calculates guaranteed write amount after equalization EW= (remaining endurance/device remaining endurance average of the entire storage device 3)×guaranteed write amount of device Di) and calculates endurance value V2=W2×(EW−Σ(write amount of logical extent included in device Di))/EW.

In step S1503, the endurance adjustment section 15 calculates capacity value V3=W3×(logical capacity of device Di−current used capacity of device Di−extent size)/logical capacity of device Di.

In step S1504, the endurance adjustment section 15 calculates additional writing ratio AR=additionally written amount of device Di/(additionally written amount of device Di+read amount of device Di+update amount of device Di) and calculates additional writing value V4=W4×(1−AR).

In step S1505, the endurance adjustment section 15 calculates the evaluation value F based on evaluation function F=V1+V2+V3+V4 and returns the evaluation value F. If V1<0 or V3<0, the evaluation value F=0.

When an allocation write destination is managed using the above evaluation function, the following effect can be obtained.

For example, the smaller the current load with respect to the performance specifications of the device, the greater a margin in load, the higher the evaluation value F with respect to the device. Accordingly, the rate of allocation writing of the extent to the device having a margin in load can be increased.

When the write amount to the device is small with respect to the guaranteed write amount, this device has a margin in endurance. When the write amount is small, the evaluation value F of the device having a margin in endurance increases according to the evaluation function. Accordingly, the rate of allocation writing of the extent to the device having a margin in endurance can be increased, and the rate of allocation writing of the extent to the device with a short endurance can be reduced.

In the calculation of the endurance value in the allocation write destination evaluation processing, the guaranteed write amount is multiplied by a ratio of the endurance of the device and the remaining endurance average of the entire device. Consequently, the evaluation value F of a newly installed device with a long remaining endurance becomes high comparing to the entire device already installed in the storage device 3. Thus, the rate of allocation writing of the extent to the newly installed device can be increased. On the other hand, the rate of allocation writing of the extent to the device with a short remaining endurance decreases, and the endurance of the device can be equalized.

In the allocation write destination evaluation processing, the smaller the current used capacity to the maximum capacity of the device, the higher the evaluation value F to the device and the easier the allocation writing becomes. Accordingly, the rate of allocation writing to the device in which the current used capacity is close to the logical capacity can be reduced.

In the allocation write destination evaluation processing, the evaluation value F of the device with a high additional writing ratio becomes low. Accordingly, the rate of allocation writing to the device in which a current allocation write amount is large decreases, and capacity tightness due to excessive allocation writing is reduced, so that the capacity can be equalized among the devices.

Here, a specific example of the allocation write destination selection processing will be described using FIGS. 16 to 20.

FIG. 16 is a data structure diagram showing one example of the device specific information table 6.

The device specific information table 6 includes device IDs D1 to D3.

FIG. 17 is a data structure diagram showing one example of the logical extent information table 8.

The logical extent information table 8 includes five logical extent IDs E1 to E5. In this embodiment, each of the logical extent IDs D1 to D3 is generalized and denoted by the logical extent IDs Ej.

FIG. 18 is a data structure diagram showing one example of the physical extent information table 9.

The physical extent information table 9 includes six physical extent IDs P1 to P6. In this embodiment, each of the physical extent IDs P1 to P6 is generalized and denoted by the physical extent IDs Pk.

For example, new allocation writing of a logical extent ID E5 in the logical extent information table 8 will be described.

First, the endurance adjustment section 15 calculates the evaluation value F of each of the devices D1 to D3 through the loop from step S1403 to step S1405 of FIG. 14.

FIG. 19 is a view showing one example of a relationship between the devices and the evaluation values.

The endurance adjustment section 15 determines allocation writing to the device D3 with a maximum evaluation value F in step S1406 of FIG. 14.

In step S1407 and S1408 of FIG. 14, the endurance adjustment section 15 makes the logical extent ID E5 correspond to the physical extent ID P6 in an empty state of the device ID D3 with a maximum evaluation value F and updates the logical extent information table 8.

FIG. 20 is a data structure diagram showing one example of the logical extent information table 8 after update.

In a record corresponding to the logical extent ID E5, the device ID D3 is stored as the belonging device ID, and the physical extent ID P6 is stored as the physical extent ID.

Figure 21:
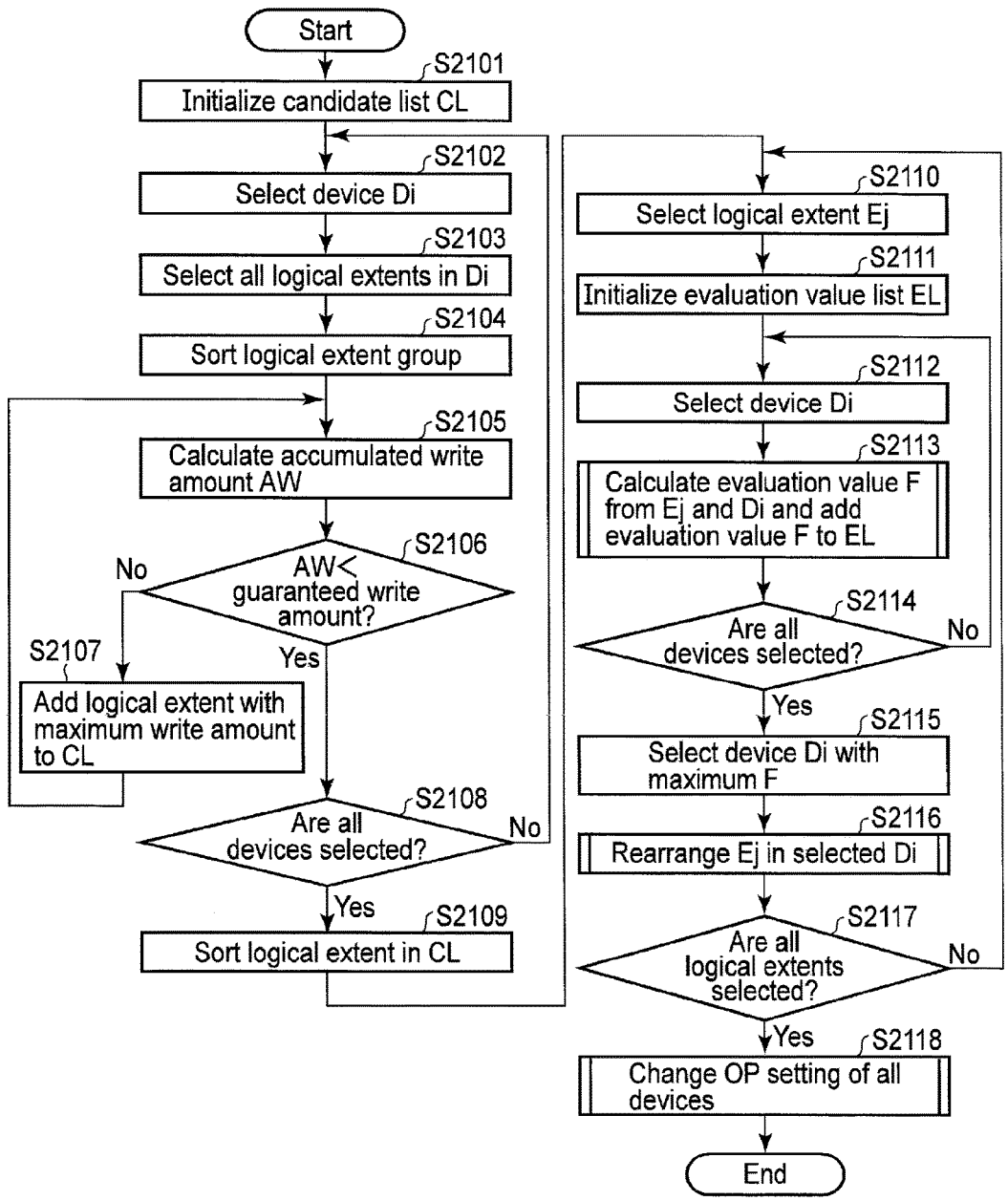
FIG. 21 is a flowchart showing one example of an endurance adjustment processing in the endurance adjustment section according to the first embodiment.

FIG. 21 is a flowchart showing one example of the endurance adjustment processing in the endurance adjustment section 15 according to this embodiment. Step S2118 in FIG. 21 corresponds to the processing in the setting change section 16 to be described later.

The endurance adjustment section 15 performs evaluation based on the device specific information table 6 for each logical extent in each of the devices $D_0$ to $D_{N-1}$ and rearranges each logical extent into a device with a high evaluation value.

The endurance adjustment section 15 changes the logical capacity of each of the devices $D_0$ to $D_{N-1}$ to setting of over-provisioning calculated based on the device specific information table 6.

In the endurance adjustment processing, the endurances of the devices $D_0$ to $D_{N-1}$ in the storage device 3 are equalized.

In the endurance adjustment processing, first, a list of logical extents serving as candidates to be rearranged is initialized by initialization processing.

Then, in the endurance adjustment processing, by processing for adding the logical extent serving as a movement candidate, one or a plurality of logical extents on the device exceeding the guaranteed write amount are selected to be determined as a movement candidate.

Then, in the endurance adjustment processing, one or a plurality of logical extents are rearranged, and unnecessary endurance and performance of each of the devices $D_0$ to $D_{N-1}$ are eliminated.

Finally, in the endurance adjustment processing, setting of over-provisioning of each of the devices $D_0$ to $D_{N-1}$ is set to a suitable value by the setting evaluation processing for over-provisioning executed by the setting change section 16 to be described later, and the processing is terminated.

In FIG. 21, step S2101 corresponds to initialization processing.

In step S2101, the endurance adjustment section 15 generates a list of logical extents, serving as candidates to be rearranged, as an empty list. The list of the logical extents serving as candidates to be rearranged is denoted by CL.

In FIG. 21, steps S2102 to S2108 correspond to the processing for adding the logical extent serving as a movement candidate.

In step S2102, the endurance adjustment section 15 selects the device ID Di in the ascending order of the device ID from the device specific information table 6.

In step S2103, the endurance adjustment section 15 refers to the logical extent information table 8 and selects all logical extent ID groups, corresponding to the belonging device ID Di, from the logical extent information table 8.

In step S2104, the endurance adjustment section 15 sorts the selected logical extent ID groups in the descending order of the write amount.

In step S2105, the endurance adjustment section 15 determines the total sum of the write amounts of the logical extent ID groups as an accumulated write amount AW.

In step S2106, the endurance adjustment section 15 judges whether or not accumulated write amount AW<guaranteed write amount.

When accumulated write amount AW<guaranteed write amount is negated, in step S2107, the endurance adjustment section 15 adds the logical extent ID with a maximum write amount to the list CL and omits it from the logical extent ID group, and the processing moves to step S2105.

When accumulated write amount AW<guaranteed write amount is affirmed, in step S2108, the endurance adjustment section 15 judges whether or not all the device IDs Di are selected from the device specific information table 6 in step S2102.

When all the device IDs Di are not selected from the device specific information table 6, the processing moves to step S2102.

When all the device IDs Di are selected from the device specific information table 6, the processing moves to step S2109.

Steps S2109 to S2117 in FIG. 21 correspond to the rearrangement destination selection processing and the rearrangement processing for a unit of the logical extent of the endurance adjustment section 15.

In step S2109, the endurance adjustment section 15 sorts the logical extents ID in the list CL in the descending order of the write amount.

In step S2110, the endurance adjustment section 15 selects the logical extent IDs Ej from the list CL in the order of larger write amount.

In step S2111, the endurance adjustment section 15 generates an initialized empty evaluation value list EL.

In step S2112, the endurance adjustment section 15 selects the device ID Di in the ascending order from the device specific information table 6.

In step S2113, the endurance adjustment section 15 calculates the evaluation value F based on the selected logical extent ID Ej, the device ID Di, and the evaluation function and adds a pair of the device ID Di and the evaluation value F (device ID Di, evaluation value F) to the evaluation value list EL.

In step S2114, the endurance adjustment section 15 judges whether or not all the device IDs are selected in step S2112.

When all the device IDs are not selected, the processing moves to step S2112. Consequently, the evaluation values F of all devices are calculated.

When all the device IDs are selected, in step S2115, the device ID Di with a maximum evaluation value F is selected from the list EL.

In step S2116, the endurance adjustment section 15 performs logical extent rearrangement processing to be described later and rearranges the logical extent Ej into the selected Di.

In step S2117, the endurance adjustment section 15 judges whether or not all the logical extent IDs EJ are selected from the list CL in step S2110.

When all the logical extent IDs are not selected from the list CL, the processing moves to step S2110. Namely, step S2110 to step S2117 are repeated until all the logical extent IDs are selected from the list CL.

When all the logical extent IDs are selected from the list CL, in step S2118, the setting change section 16 executes the setting evaluation processing for over-provisioning and changes setting of over-provisioning of all of the devices $D_0$ to $D_{N-1}$ to a suitable value.

In the processing of FIG. 21, the processing in steps S2109 to S2118 can be suitably changed.

Figure 22:
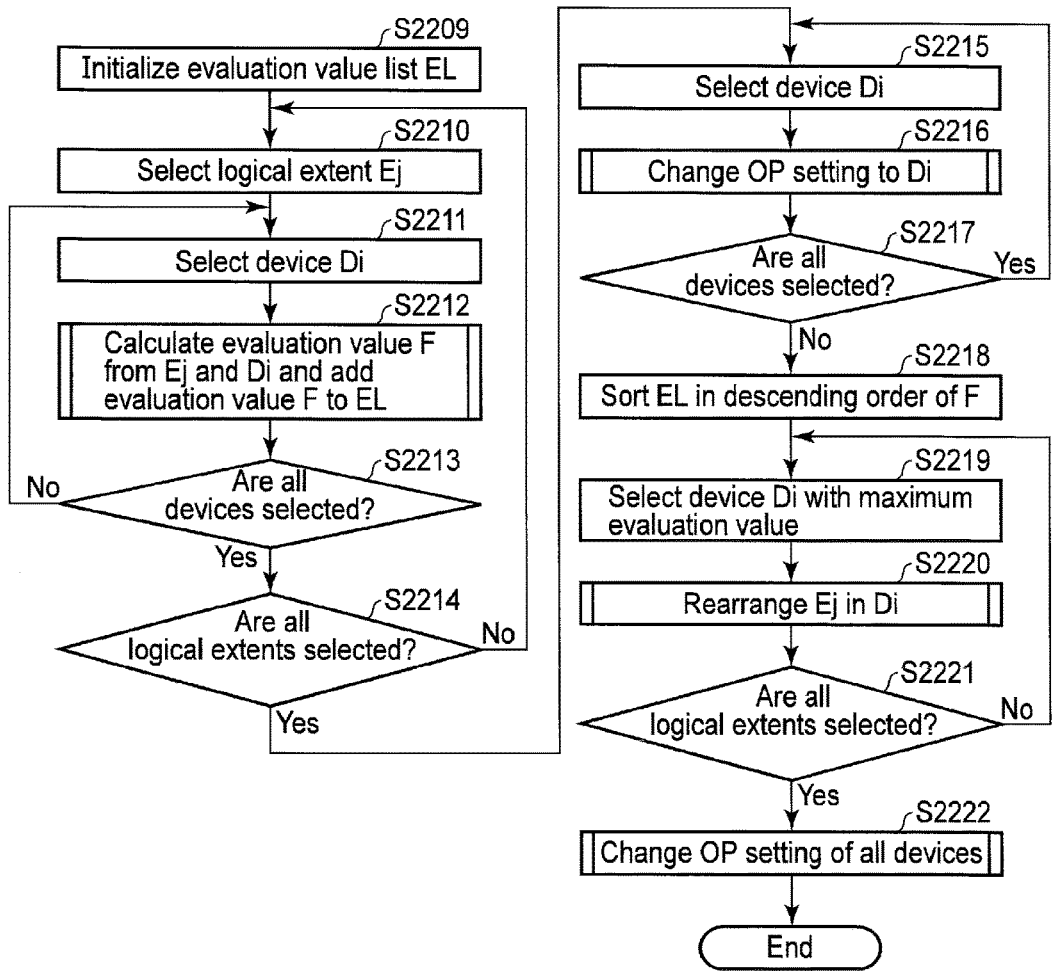
FIG. 22 is a flowchart showing a variation of the endurance adjustment processing in the endurance adjustment section according to the first embodiment.

FIG. 22 is a flowchart showing a variation of the endurance adjustment processing in the endurance adjustment section 15 according to this embodiment. In FIG. 21, the logical extent is rearranged for each calculation of the evaluation value F. Instead of this, in FIG. 22, the evaluation value F with respect to a combination of all logical extents and devices is calculated, and the priority order of rearrangement is judged based on the evaluation value F with respect to a combination of all logical extents and devices.

In step S2209, the endurance adjustment section 15 initializes an evaluation value list for storing an evaluation value as an empty list. The evaluation value list is denoted by EL.

In step S2210, the endurance adjustment section 15 selects the logical extent ID Ej in the list CL.

In step S2211, the endurance adjustment section 15 selects the device ID Di in the ascending order from the device specific information table 6.

In step S2212, the endurance adjustment section 15 calculates the evaluation value F based on the selected logical extent ID Ej, the device ID Di, and the evaluation function and adds a pair of the device ID Di and the evaluation value F (device ID Di, evaluation value F) to the evaluation value list EL.

In step S2213, the endurance adjustment section 15 judges whether or not all the device IDs are selected in step S2211.

When all the device IDs are not selected, the processing moves to step S2211. Consequently, the evaluation values F of all devices are calculated.

When all the device IDs are selected, the endurance adjustment section 15 judges whether or not all the logical extent IDs in the list CL are selected in step S2214.

When all the logical extent IDs in the list CL are not selected, the processing moves to step S2210. Consequently, step S2210 to step S2214 are repeated until all the logical extent IDs in the list CL are selected.

Steps S2215 to S2221 in FIG. 22 correspond to the rearrangement destination selection processing and the rearrangement processing for a unit of the logical extent executed by the endurance adjustment section 15.

In step S2215, the endurance adjustment section 15 selects the device Di in the ascending order from the device specific information table 6.

In step S2216, the endurance adjustment section 15 performs setting change processing for over-provisioning with respect to the device ID Di. The logical capacity serving as an input value in the setting change processing is a capacity corresponding to the logical extent rearranged into the device indicated by the device ID Di. Namely, the logical capacity serving as an input value in the setting change is, for example, a sum of a present logical capacity and a capacity corresponding to the number of pairs including the device ID Di in the evaluation value list EL×extent size.

In step S2217, the endurance adjustment section 15 judges whether or not all the device IDs are selected in step S2215.

When all the device IDs are not selected, the processing moves to step S2215. Consequently, the processing in step S2216 is executed with respect to all devices.

When all the device IDs are selected, in step S2218, the endurance adjustment section 15 sorts the evaluation value lists EL in the descending order of the evaluation value F.

In step S2219, the endurance adjustment section 15 selects the logical extent ID Ej and the device ID Di with a maximum evaluation value F in the evaluation value list EL.

In step S2220, the endurance adjustment section 15 rearranges the selected logical extent ID Ej into the device indicated by the selected device ID Di.

In step S2221, the endurance adjustment section 15 judges whether or not all of the logical extent IDs and the device IDs are selected from the list EL in step S2219.

When all of the logical extent IDs and the device IDs are not selected from the list EL, the processing moves to step S2219. Namely, step S2219 to step S2221 are repeated until all of the logical extent IDs and the device IDs are selected from the list EL.

When all of the logical extent IDs and the device IDs are selected from the list EL, in step S2222, the setting change section 16 executes the setting evaluation processing for over-provisioning and changes setting of over-provisioning of all of the devices $D_0$ to $D_{N-1}$ to a suitable value.

For example, in the processing in FIG. 21, at the rearrangement of the logical extent, a remaining capacity of the device with a large evaluation value F may be insufficient, and the device with the large evaluation value F may not serve as a rearrangement destination. Thus, for example, even a device desired to serve as a rearrangement destination because of the long remaining endurance may possibly not be selected as the rearrangement destination due to the insufficient capacity. However, in the processing in FIG. 22, the logical capacity corresponding to the logical extent to be rearranged is previously secured for each device, whereby it is possible to prevent a situation where the logical extent is not rearranged into the device with a large evaluation value F due to the insufficient capacity.

Here, a specific example of the endurance adjustment processing will be described using FIGS. 23 to 27. A record of each table before the endurance adjustment processing is similar to FIGS. 16 to 18 and 20, for example.

In step S2101, the endurance adjustment section 15 initializes the list CL of rearrangement candidates.

In steps S2102 to S2104, the endurance adjustment section 15 sorts the logical extent IDs Ej, corresponding to the device ID Di, for each of the device IDs Dj.

In step S2105, the endurance adjustment section 15 calculates the accumulated write amount AW as the total sum of the write amounts of the logical extent for each of the device IDs Di.

FIG. 23 is a view exemplifying the accumulated write amount for each of the device IDs.

In FIG. 23, in the device indicated by the device ID D1, the accumulated write amount is larger than the guaranteed write amount. Accordingly, the processing to the device ID D1 moves from step S2106 to step S2107, and the endurance adjustment section 15 adds, among the logical extents corresponding to the device ID D1, the logical extent ID corresponding to a maximum write amount to the candidate list CL.

The endurance adjustment section 15 calculates the accumulated write amount again in step S2105. In this case, in step S2106, since the accumulated write amount AW is less than the guaranteed write amount, the processing moves to step S2108. Similar processing is executed with respect to all the device IDs. In the example of FIG. 23, the list CL includes only logical extent ID E2. In this example, since only one logical extent ID is included in the list CL, the sorting in step S2109 is not required. In step S2110, the endurance adjustment section 15 selects the logical extent ID E2.

In the loop from step S2112 to step S2114, the endurance adjustment section 15 calculates the evaluation value F, corresponding to each of the device IDs, through the rearrangement destination evaluation processing.

FIG. 24 is a view exemplifying the evaluation value F for each of the device IDs. In FIG. 24, the device ID D3 has a maximum evaluation value F.

FIG. 25 is a data structure diagram showing one example of the logical extent information table 8 after rearrangement.

The endurance adjustment section 15 selects the device ID D3 in step S2115 and rearranges the logical extent, indicated by the logical extent ID E2, into the physical extent included in the device indicated by the device ID D3 and indicated by the physical extent ID P5 in step S2116.

FIG. 26 is a data structure diagram showing one example of the device specific information table 6 after rearrangement. The endurance adjustment section 15 reduces the current used capacity corresponding to the device ID D1 in the device specific information table 6. The endurance adjustment section 15 increases the current used capacity corresponding to the device ID D3 in the device specific information table 6 to increase the remaining write amount, and thus to increase an update amount.

In step S2118, the endurance adjustment section 15 executes the setting evaluation processing for over-provisioning and changes setting of over-provisioning of all of the devices $D_0$ to $D_{N-1}$.

FIG. 27 is a view showing an example of evaluation results obtained by the setting evaluation processing for over-provisioning.

The evaluation results include, for each of the device IDs D1 to D3, the performance value V1, the guaranteed write amount after equalization EW, the accumulated write amount AW, the endurance value V2, the capacity value V3, the additional writing ratio AR, the additional writing value V4, the evaluation value F, a capacity increase amount or capacity decrease amount V, a logical capacity before calculation, a logical capacity after calculation, and a difference between the logical capacity after calculation and the logical capacity before calculation.

The logical capacity before calculation is an original logical capacity of each device. The logical capacity after calculation is a logical capacity after a change in over-provisioning setting. In the evaluation results in FIG. 27, in the device ID D1 with a lot of writing, the logical capacity does not increase so much, so that allocation writing is less likely to be performed.

Figure 28:
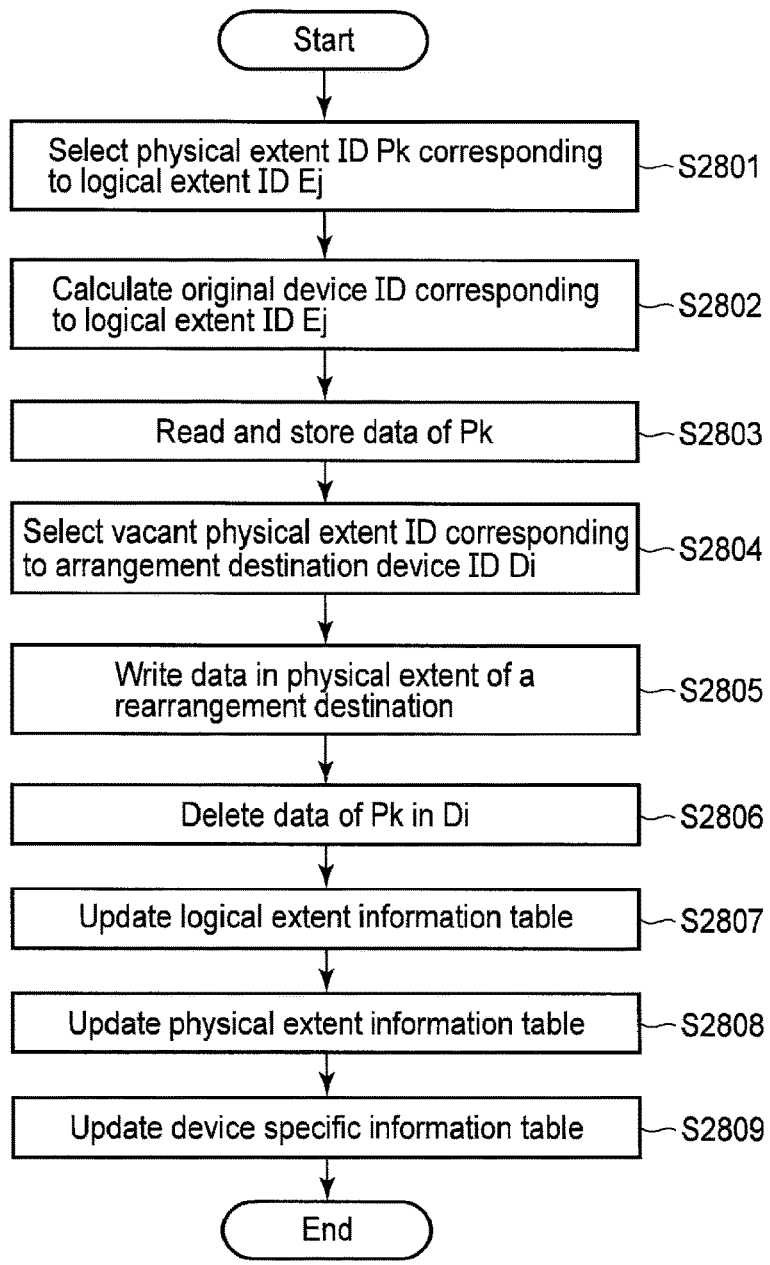
FIG. 28 is a flowchart showing one example of a rearrangement processing in the endurance adjustment section according to the first embodiment.

FIG. 28 is a flowchart showing one example of the rearrangement processing in the endurance adjustment section 15 according to this embodiment. In the rearrangement processing, the endurance adjustment section 15 inputs the logical extent ID Ej and the device ID Di of a rearrangement destination and rearranges extent.

In FIG. 28, steps S2801 to S2806 correspond to the read processing of data from an original device before rearrangement and the writing processing to a device as an arrangement destination.

In step S2801, the endurance adjustment section 15 refers to the logical extent information table 8 and selects the physical extent ID Pk corresponding to the logical extent ID Ej.

In step S2802, the endurance adjustment section 15 refers to the physical extent information table 9 and selects the device ID of an original device corresponding to the physical extent ID Pk.

In step S2803, the endurance adjustment section 15 reads data from the physical extent indicated by the physical extent ID Pk and stores the data in the buffer memory.

In step S2804, the endurance adjustment section 15 refers to the physical extent information table 9 and selects the physical extent ID of an arbitrary rearrangement destination which corresponds to the device ID Di of an arrangement destination and in which the vacancy information shows "vacancy".

In step S2805, the endurance adjustment section 15 writes data, stored in the buffer memory, in the physical extent indicated by the selected physical extent ID of a rearrangement destination.

In step S2806, the endurance adjustment section 15 deletes data of the physical extent indicated by the physical extent ID Pk. When an original device conforms to SATA (Serial ATA), data is deleted using a trim command. When an original device conforms to SAS (Serial Attached SCSI), data is deleted using an unmap command.

In FIG. 28, steps S2807 to S2809 correspond to table update processing. The execution order of steps S2807 to S2809 can be freely changed, and these steps may be executed in parallel.

In step S2807, the endurance adjustment section 15 refers to the logical extent information table 8, changes the belonging device ID, corresponding to the logical extent ID Ej, to the device ID indicating a device as a rearrangement destination, and changes the physical extent ID, corresponding to the physical extent ID Ej, to the physical extent ID indicating the physical extent of the rearrangement destination.

In step S2808, the endurance adjustment section 15 refers to the physical extent information table 9, changes the vacancy information, corresponding to the original physical extent ID Pk before rearrangement, to "vacancy" and changes vacancy information, corresponding to the physical extent ID of a rearrangement destination, to "use".

In step S2809, the endurance adjustment section 15 refers to the device specific information table 6, reduces the current used capacity, corresponding to the device ID indicating an original device, by the extent size, increases the current used capacity, corresponding to the device ID Di of an arrangement destination, by the extent size, and reduces the remaining write amount of the device ID Di of the arrangement destination by the extent size.

FIG. 29 is a flowchart showing one example of the rearrangement destination evaluation processing in the endurance adjustment section 15 according to this embodiment.

The rearrangement destination evaluation processing in the endurance adjustment section 15 is similar to the allocation write destination evaluation processing in the endurance adjustment section 15.

In step S2901, the endurance adjustment section 15 calculates performance value $V1=W1\times$(performance specifications of device Di-maximum load of device Di)/performance specifications of device Di. Step S2901 differs from step S1501 of the allocation write destination evaluation processing using IOPS of the device Di in that the maximum load of the device Di is used.

In step S2902, the endurance adjustment section 15 calculates the endurance value V2 as in step S1501 of the allocation write destination evaluation processing.

In step S2903, the endurance adjustment section 15 calculates capacity value $V3=W3\times$(maximum capacity of device Di-current used capacity of device Di-extent size)/logical capacity of device Di. In step S1503 in the allocation write destination evaluation processing, although the logical capacity of the device Di is used, in step S2903, the maximum capacity of the device Di is used instead of this. In the allocation write destination evaluation processing, since the logical extent cannot be newly arranged in the device exceeding a current logical capacity, when the logical capacity of the device Di and the current used capacity of the device Di are equal to each other, the evaluation value is zero. On the other hand, in the endurance adjustment processing, since the logical capacity of the device Di can be increased later by a setting change of over-provisioning, the logical extent can be rearranged exceeding the logical capacity of the device Di. However, rearrangement exceeding a maximum capacity cannot be performed.

In step S2904, the endurance adjustment section 15 calculates the additional writing value V4.

In step S2905, the endurance adjustment section 15 calculates the evaluation value F based on evaluation function $F=V1+V2+V3+V4$ and returns the evaluation value F.

When the rearrangement destination evaluation processing is executed, the effects substantially similar to those of the allocation write destination evaluation processing can be obtained.

FIG. 30 is a flowchart showing one example of the setting change processing for over-provisioning executed by the setting change section 16 according to this embodiment.

The device ID Di and the logical capacity LV are input to the setting change section 16.

In step S3001, the setting change section 16 instructs the setting change of over-provisioning to the device Di with an SCSI command or the like and changes the logical capacity of the device, indicated by the device Di, to a value of LV.

In step S3002, the setting change section 16 judges whether or not the logical capacity of the device indicated by the device Di increases.

When the logical capacity of the device Di increases, the processing moves to step S3003, and when the logical capacity of the device Di does not increase, the processing moves to step S3004.

In step S3003, the setting change section 16 refers to the physical extent information table 9 and calculates capacity increase amount V=LV−current logical capacity of device Di. The setting change section 16 refers to the device specific information table 6 and obtains the logical capacity of the device Di. The setting change section 16 selects the physical extent groups whose number is (capacity increase amount V/extent size) and in which the vacancy information is "non-use region", in the ascending order of the physical extent ID. The setting change section 16 sets the vacancy information of the physical extent group in which the vacancy information is "non-use region" to "vacancy"

In step S3004, the setting change section 16 refers to the physical extent information table 9 and calculates capacity decrease amount V=current logical capacity of device Di−logical capacity LV. The setting change section 16 refers to the device specific information table 6 and obtains the logical capacity of the device Di. The setting change section 16 selects the physical extent groups whose number is (V/extent size) and in which the vacancy information is "vacancy", in the ascending order of the physical extent ID. The setting change section 16 sets the vacancy information of the physical extent group in which the vacancy information is "vacancy" to "non-use region".

In step S3005, the setting change section 16 refers to the device specific information table 6 and changes the logical capacity, corresponding to the device ID Di, to the logical capacity LV.

FIG. 31 is a flowchart showing one example of the setting evaluation processing for over-provisioning (residual capacity evaluation processing) executed by the setting change section 16 according to this embodiment.

The setting evaluation processing for over-provisioning is executed in step S2119 of FIG. 21 and step S2222 of FIG. 22, for example.

In the setting evaluation processing, after extent is rearranged, the logical capacity of each device is set such that the endurances are equalized.

In step S3101, the setting change section 16 selects the device ID Di indicating the device in which the setting of over-provisioning is to be changed.

In step S3102, the setting change section 16 calculates a specific percentage (for example, 10%) of the maximum capacity of the device ID Di as a standard residual capacity. The setting change section 16 calculates logical capacity LV=current used capacity of device Di+standard residual capacity+additionally written amount of device Di×1.2. Here, although the additionally written amount is multiplied by 1.2, this is because the logical capacity LV having a margin is calculated even if the additionally written amount increases by 20% compared to the current level. The logical capacity LV falls within a range not exceeding the maximum capacity. In the calculation expression for the logical capacity LV, capacity shortage is prevented by adding the standard residual capacity. Further, in the calculation expression for the logical capacity LV, by adding the additionally written amount, even if comparable allocation writing occurs after the endurance adjustment processing, capacity shortage is prevented.

In step S3103, the setting change section 16 performs the setting change processing for over-provisioning described in FIG. 30, based on the device ID Di and the logical capacity LV.

In step S3104, the setting change section 16 judges whether or not setting of over-provisioning of all devices has been executed.

When the setting of over-provisioning of all devices is not executed, that is, when rearrangement of all devices is not completed, the processing moves to step S3101, and the above processing is repeated.

When the setting of over-provisioning of all devices has been executed, the processing is terminated.

As described above, in the setting evaluation processing, the logical capacity of the device with a large allocation write amount (additionally written amount) is increased, whereby it is possible to prevent a situation where the device with a large allocation write amount is not selected as an allocation write destination due to capacity shortage.

In the above-described embodiment, with respect to the individual devices $D_0$ to $D_{N-1}$, allocation writing, rearrangement, and setting of over-provisioning are performed based on the evaluation value F, and the devices $D_0$ to $D_{N-1}$ in the storage device 3 can be equalized in endurance, capacity, and performance.

In this embodiment, by virtue of the selection of the allocation write destination, occurrence of allocation writing can be suppressed with respect to a device with a short remaining endurance and a device in which the write amount per unit time is close to the guaranteed write amount, and the endurances of the devices $D_0$ to $D_{N-1}$ can be increased.

In this embodiment, the extent with a large write amount can be rearranged in a device with a long remaining endurance and a device with a small write amount with the use of the evaluation function, and a future write amount to a device with a short endurance can be reduced.

In this embodiment, even if the endurances of the devices in the storage device 3 are unequal due to addition of an unused device or replacement of a failed device, by virtue of the allocation write destination evaluation processing, the rearrangement destination evaluation processing, and the setting evaluation processing for over-provisioning, writing to a device with a short endurance is suppressed, writing to a device with a long endurance is increased, and the endurances can be equalized in the entire storage device 3.

In this embodiment, by virtue of the allocation write destination evaluation processing, the rearrangement destination evaluation processing, and the setting evaluation processing for over-provisioning, allocation writing to a device with a high load is reduced, allocation writing to a device with a low load is increased, and the performances can be equalized in the entire storage device 3. When new data is written, the new data tends to be read or written in a short period of time. In this embodiment, writing of new data to a device with a high load can be reduced, whereby writing and reading to a device with a high load can be suppressed.

In this embodiment, rearrangement of data is executed based on the evaluation value F.

Consequently, in this embodiment, it is possible to reduce future load and writing with respect to a device with a high load, a device in which excessive writing is done, and a device with a short remaining endurance. On the contrary, it is possible to increase writing to a device with a low load, a device with small writing, and a device having a margin in remaining endurance, and performances and endurances can be equalized.

In this embodiment, the logical capacity of the device is changed. For example, writing to a region where writing has never been performed is regarded as new writing. In this embodiment, the logical capacities of the device with a high load, the device in which excessive writing is done, and the device with a short remaining endurance can be reduced, and new writing can be suppressed by reducing the evaluation value F. On the contrary, in this embodiment, the logical capacities of the device with a low load, the device with small writing, and a device having a margin in remaining endurance can be increased. The evaluation value F can be increased, and new writing can be increased. As described above, the decrease or increase in the logical capacity of the device influences on the evaluation value F, and equalization in performance and endurance can be achieved.

In this embodiment, equalization in performance and endurance can be achieved by selecting a write destination based on the evaluation value F during new writing. In this embodiment, for example, when the write amount is large, the evaluation value is reduced, whereby the rate of new writing to a device in which excessive writing is done relative to a reference value can be reduced. On the contrary, in this embodiment, it is possible to increase the evaluation value F of a device with a small write amount, increase the rate of a device serving as a new write destination, and equalize the endurance of the storage device 3. Similarly, in this embodiment, the evaluation value F of a device with a high load is reduced, new writing to the device with a high load is reduced without using the device as a new write destination. On the other hand, the evaluation value F of a device with a low load is increased to increase the rate of a device serving as a new write destination. Whereby the performance of the device can be equalized.

Second Embodiment

In this embodiment, a variation of the first embodiment will be described. In this embodiment, for example, parameters used in various evaluation processing such as allocation write destination evaluation processing, rearrangement destination evaluation processing, and setting evaluation processing for over-provisioning may be changed. In this embodiment, parameters of a storage device 3 included in an evaluation function may be adjusted in accordance with instructions from host devices 21 to 23. Consequently, the storage device 3 can be optimized in accordance with a user policy by adjusting an index of placing importance on, such as setting in which importance is placed on a reduction in performance load relative to suppression of a write amount or setting in which importance is placed on the suppression of the write amount relative to the reduction in performance load.

In this embodiment, parameters will be described using the case of weights used in various evaluation processing as an example. However, the parameters may be numerical values other than weights or constants included in the evaluation function, for example.

FIG. 32 is a block diagram showing one example of the storage device 3 including a memory controller 5 according to this embodiment.

In this embodiment, a processor 52 executes a control program CP stored in a memory 51 and executes functions as a policy change section 19. The memory 51 stores a policy information table 20.

The policy change section 19 updates the policy information table 20 in accordance with a policy setting command received from any of the host devices 21 to 23 via a host interface 4.

The policy information table 20 manages a combination of the weights used in various evaluation processing and their values.

Figures 33, 34:
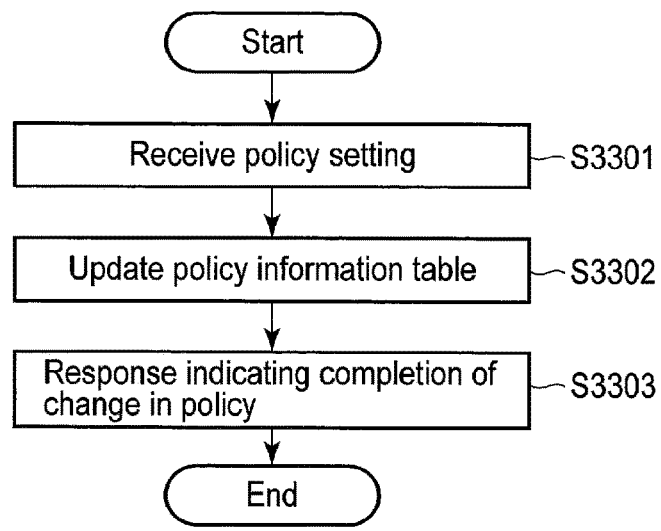
FIG. 33 is a flowchart showing one example of processing in a policy change section according to the second embodiment.
FIG. 34 is a data structure diagram showing one example of a policy information table according to the second embodiment.

FIG. 33 is a flowchart showing one example of processing in the policy change section 19 according to this embodiment.

In step S3301, the policy change section 19 receives, as new policy setting, at least one of weights W1 to W4 from any of the host devices 21 to 23 via the host interface 4.

In step S3302, the policy change section 19 updates the policy information table 20 based on new policy setting.

In step S3303, the policy change section 19 transmits a response indicating completion of a change in policy to any of the host devices 21 to 23 via the host interface 4.

FIG. 34 is a data structure diagram showing one example of the policy information table 20 according to this embodiment.

In the policy information table 20, the weights W1 to W4 are managed as coefficients used in evaluation processing, and a value set by a user is associated with each of the weights W1 to W4.

In the above-described embodiment, a user can freely set, as policies, weights in, for example, the allocation write destination evaluation processing or the rearrangement destination evaluation processing. Consequently, evaluation processing performed based on performance, endurance, capacity, and additionally written amount can be optimized according to user's needs.

For example, when importance is placed on the performance, by increasing a value of the weight W1 associated with a performance value V1, concentration of allocation writing is prevented, and equalization in performance can be achieved. For example, in the allocation write destination evaluation processing, when the value of the weight W1 is increased, an evaluation value F of a device with a low performance load increases, and the device easily becomes an allocation write destination. Accordingly, the rate of allocation writing to the device with a low performance load is increased, and equalization in performance can be achieved.

The effects of this embodiment will be more specifically described.

In the first embodiment, the weights W1 to W4 used in various evaluation processing are the same value between evaluation items and are constants. In this case, for example, since a newly added device has a long remaining endurance, an evaluation value calculated in evaluation processing increases, so that the device is likely to be selected as an allocation write destination. As a result, in the newly added device, allocation writing is concentrated, so that performance degradation may occur.

In this embodiment, for example, when a device is newly added, the weight W1 of the performance value V1 in the calculation in the allocation write destination evaluation processing is increased. Thus, by virtue of the increase in the weight W1, importance is placed on the performance in the storage device 3, and the evaluation value F of a device with a low performance load increases, so that the device is likely to be selected as an allocation write destination. As described above, when the weight W1 is increased, it is possible to prevent concentration of allocation writing on a newly added device, increase the rate of allocation writing to a device with a low performance load, and equalize the performances of the devices $D_0$ to $D_{N-1}$.

For example, when a user wants to place importance on a remaining endurance, allocation writing to a device with a short endurance can be reduced by increasing the weight W2 associated with an endurance value V2.

As described above, by changing the values of the weights W1 to W4, influences of performance, endurance, capacity, and additionally written amount can be optimized according to user's needs.

Third Embodiment

This embodiment is a variation of the first and second embodiments. In the first and second embodiments, the case where each of the devices $D_0$ to $D_{N-1}$ is, for example, a single SSD has been described. On the other hand, in this embodiment, a case where each of the devices $D_0$ to $D_{N-1}$ is plural RAID (Redundant Arrays of Inexpensive Disks) groups (RAID device) will be described. A memory controller 5 according to this embodiment manages a storage region (physical region) on the RAID group in a unit of extent (physical extent). The storage device 3 provides, as plural logical disks $LD_0$ to $LD_{N-1}$, storage regions of the plural RAID groups to host devices 21 to 23.

The storage device 3 of the first and second embodiments corresponds to RAID0. Instead of RAID0 not considering redundancy, in this embodiment, the storage device 3 corresponding to RAID1 to RAID5 considering redundancy will be described.

FIG. 35 is a block diagram showing one example of the storage device 3 including the memory controller 5 according to this embodiment.

In this embodiment, a processor 52 executes a control program CP stored in a memory 51 and executes functions as a RAID processing section 24. The memory 51 stores a RAID group information table 25 and an SSD specific information table 26.

In this embodiment, the devices $D_0$ to $D_{N-1}$ are each the RAID group, for example, and include plural SSDs.

With respect to the plural SSDs in the devices $D_0$ to $D_{N-1}$, setting of over-provisioning can be changed even after operation of the devices $D_0$ to $D_{N-1}$.

RAID levels of the devices $D_0$ to $D_{N-1}$ are the same in the storage device 3. Although this embodiment is applicable to various RAID levels, the case of RAID1 will be described as an example.

In this embodiment, the number of the SSDs provided in each of devices $MD_0$ to $MD_{N-1}$ may be different. A stripe size of RAID may be 256 Kbyte or 512 Kbyte, for example.

In this embodiment, the SSDs in the devices $D_0$ to $D_{N-1}$ have the same setting of over-provisioning. In RAID0 or RAID 5, for example, writing to the SSD is substantially uniform among the SSDs in the devices $D_0$ to $D_{N-1}$. Thus, remaining write amounts of the SSDs in the devices $D_0$ to $D_{N-1}$ are assumed to be equivalent. The storage device 3 includes one or more auxiliary memory devices 27, such as SSD for hot spare, in addition to the devices $D_0$ to $D_{N-1}$.

In the first and second embodiments, the individual SSDs correspond to the devices $D_0$ to $D_{N-1}$, and read processing, write processing, and endurance adjustment processing are executed with respect to the individual devices $D_0$ to $D_{N-1}$. On the other hand, in this embodiment, similar processing is performed using the individual devices $D_0$ to $D_{N-1}$ for the unit of RAID group as virtual devices.

The RAID processing section 24 stores setting values in the RAID group information table 25 and the SSD specific information table 26 when RAID is applied in the storage device 3. For example, the RAID processing section 24 initializes the RAID group information table 25 and the SSD specific information table 26, registers information on the RAID group information table 25 and the SSD specific information table 26, and updates the RAID group information table 25 and the SSD specific information table 26.

The RAID group information table 25 manages the SSD belonging to each of the devices $D_0$ to $D_{N-1}$.

The SSD specific information table 26 manages individual information of the SSD belonging to each of the devices $D_0$ to $D_{N-1}$.

FIG. 36 is a data structure diagram showing one example of the RAID group information table 25 according to this embodiment.

The RAID group information table 25 stores device IDs, RAID levels, and belonging SSD IDs while associating them with each other. Information with respect to all the devices $D_0$ to $D_{N-1}$ in the storage device 3 are entered into the RAID group information table 25.

The device ID is the same as the device ID in the device specific information table 6.

The RAID level represents the RAID level in the storage device 3. The RAID level may be set with reference to RAID setting already executed in the storage device 3.

The belonging SSD ID is ID indicating the SSDs included in the devices $D_0$ to $D_{N-1}$.

FIG. 37 is a data structure diagram showing one example of the SSD specific information table 26 according to this embodiment.

Information of all SSDs in the storage device 3 are entered into the SSD specific information table 26.

In FIG. 37, a maximum capacity, a logical capacity, a current used capacity, a remaining write amount, and a guaranteed write amount are associated with the SSD device ID.

FIG. 38 is a flowchart showing one example of processing in the RAID processing section 24 according to this embodiment.

The RAID processing section 24 initializes each table associated with the RAID group added to the storage device 3. In FIG. 38, it is assumed that association between each SSD and the RAID group has been completed.

In step S3801, the RAID processing section 24 judges whether or not setting of all the SSDs in the storage device 3 is completed.

When setting of all the SSDs in the storage device 3 is completed, processing moves to step S3804.

When setting of all the SSDs in the storage device 3 is not completed, the RAID processing section 24 selects an unset SSD in step S3802.

In step S3803, the RAID processing section 24 generates a record, corresponding to the selected SSD, with respect to the SSD specific information table 26. Then, the processing moves to step S3801.

In step S3804, the RAID processing section 24 judges whether or not setting of all the RAID groups in the storage device 3, that is, the devices $D_0$ to $D_{N-1}$ is completed.

When setting of all the RAID groups in the storage device 3 is completed, processing moves to step S3807.

When setting of all the RAID groups in the storage device 3 is not completed, the RAID processing section 24 selects an unset RAID group in step S3805.

In step S3806, the RAID processing section 24 generates a record, corresponding to the selected RAID group, with respect to the RAID group information table 25.

In the record generation in the RAID group information table 25, various IDs are unique information in the RAID group information table 25.

As the RAID level, setting obtained by referring to RAID configuration information of the storage device 3 is set.

In the belonging SSD device ID, the SSD device ID included in the RAID configuration information is set.

After generation of the record corresponding to the selected RAID group, the processing moves to step S3804.

In step S3807, the RAID processing section 24 judges whether or not record addition processing related to all the RAID groups in the storage device 3 is completed.

When the record addition processing related to all the RAID groups in the storage device 3 is completed, the processing is terminated.

When the record addition processing related to all the RAID groups in the storage device 3 is not completed, in step S3808, the RAID processing section 24 selects the RAID group in which the record addition processing is not executed.

In step S3809, the RAID processing section 24 executes the record addition processing, corresponding to the selected RAID group, with respect to the device specific information table 6.

For example, the RAID processing section 24 sets the device ID of the RAID group information table 25 as the device ID in the device specific information table 6.

For example, the RAID processing section 24 sets, as the maximum capacity and the logical capacity in the device specific information table 6, different values according to the RAID level. For example, when the RAID level is RAID1, the RAID processing section 24 sets one of the values of the SSDs belonging to the RAID group. When the RAID level is RAID0, the RAID processing section 24 sets a total of maximum capacities of the SSDs to the maximum capacity. Also in the logical capacity, different values are set according to the RAID level.

For example, the RAID processing section 24 sets, as the guaranteed write amount in the device specific information table 6 and performance specifications, one of the values of the SSDs belonging to the RAID group.

For example, the RAID processing section 24 initializes the current used capacity, the read amount, the update amount, the additionally written amount, and the maximum load in the device specific information table 6 with zero.

After execution of the record addition processing, the processing moves to step S3807.

In the above-described embodiment, when the devices $D_0$ to $D_{N-1}$ function as the RAID group, each of the devices $D_0$ to $D_{N-1}$ can be treated as a virtual device, and the effects similar to those of the first and second embodiments can be obtained. Namely, in this embodiment, equalization in performance and endurance can be achieved between plural disk arrays of the storage device 3.

Fourth Embodiment

In this embodiment, by comparing the storage devices 3 according to the first to third embodiments and a storage device of a comparative example, the effectiveness of the storage devices 3 according to the first to third embodiments will be described.

The storage device of the comparative example includes plural SSDs having different write endurances in order to prevent endurance degradation of a flash memory in an SSD, selects the SSD serving as a date write destination, and thereby prevents endurance degradation of the flash memory. A write endurance is a remainder obtained by subtracting a write amount to date from a total write amount of the SSD guaranteed by a vendor. In the storage device of the comparative example, between the SSD including an SLC (Single Level Cell) having a long write endurance but a unit price per 1 bit is high and the SSD including an MLC (Multi Level Cell) having a short write endurance but a unit price per 1 bit is low, data with a large write amount is written in the SSD of the SLC, and data with a small write amount is written in the SSD of the MLC. In the storage device of the comparative example, a workload of the storage device of the comparative example, that is, the write amount to the storage device of the comparative example and a used capacity of a user are previously assumed, and the number of the SSDs of the SLC and the number of the SSDs of the MLC are determined such that the endurance and capacity suitable for the workload are provided.

In order to obtain the endurance and capacity of the storage device of the comparative example suitable for the workload, the following consideration is made.

The capacity of the SSD of the SLC is represented by Ss. The capacity of the SSD of the MLC is represented by Sm. The write endurance of the SSD of the SLC is represented by Ws. The write endurance of the SSD of the MLC is represented by Wm. The number of the SSDs of the SLC is represented by Ps. The number of the SSDs of the MLC is represented by Pm.

A usable maximum capacity assumed in the storage device of the comparative example is represented by St, and an assumed total write amount is represented by Wt.

The storage device of the comparative example is desired to always satisfy the following formulate (1) and (2) in the period of its use.

$$Sm \times Pm + Ss \times Ps > St \quad (1)$$

$$Wm \times Pm + Ws \times Ps > Wt \quad (2)$$

When the formula (1) is not established, it shows that the capacity is insufficient. When the formula (2) is not established, it shows that the write endurance is insufficient.

The storage device of the comparative example previously assumes St and Wt such that a total of costs of the SSDs in the storage device of the comparative example is minimum, while satisfying the above formulae (1) and (2), and determines the number Ps of the SSDs of the SLC and the number Pm of the SSDs of the MLC.

However, in the storage device of the comparative example, it is difficult to accurately grasp the workload to the storage device of the comparative example before operation. Further, the workload changes after operation every second. Thus, even in a configuration considered to be optimum for an assumed workload, after operation of the storage device of the comparative example, the current write amount changes from an assumed write amount, and the endurance may be degraded or may become excessively long. More specifically, when the storage device of the comparative example includes the excessive number of the SSDs with respect to an actual workload, Wt in the formula (2) is much less than the assumed value, and although there are no problems in termination of operation itself before reaching the write endurance, the excessive number of the SSDs will be provided, so that a cost may be increased. When the number of the SSDs in the storage device of the comparative example is insufficient with respect to the actual workload, Wt in the formula (2) is more than the assumed value, and the write endurance is expired prior to the period guaranteed by a vendor, so that the SSD may be required to be replaced in the middle of the operation.

In the storage device of the comparative example, St is more than the value assumed in the formula (1), so that the capacity may be insufficient. In the storage device of the comparative example, St is less than the value assumed in the formula (1), so that the capacity may be excessive.

On the other hand, the storage devices 3 according to the first to third embodiments optimize the endurance and the capacity according to the workload with the use of the devices $D_0$ to $D_{N-1}$ in which setting of over-provisioning can be changed after operation. The effects of over-provisioning include the effect that the write endurances of the devices $D_0$ to $D_{N-1}$ can be changed (decreased or increased) by changing a non-usable region. In the first to third embodiments, the logical capacity is suitably set by over-provisioning with the use of the devices $D_0$ to $D_{N-1}$ in which setting of over-provisioning can be changed after operation. Thus, the write amounts of the devices $D_0$ to $D_{N-1}$ can be made suitable according to an actual change in workload.

In the storage devices 3 according to the first to third embodiments, since setting of over-provisioning and arrangement of data are executed following a change in workload during operation of the storage device 3, the endurances and capacities of the devices $D_0$ to $D_{N-1}$ can be suitably set to the workload.

In the storage devices 3 according to the first to third embodiments, during operation, a new device may be added or replaced due to reasons such as failure of any one of the devices $D_0$ to $D_{N-1}$, endurance, and an increase in a used capacity. Even in this case, in the storage devices 3 according to the first to third embodiments, the write endurance of each device in the storage device 3 does not become imbalance among the devices. In the storage devices 3 according to the first to third embodiments, writing to a device nearly reaching the write endurance is reduced, and writing to a device having a satisfactory write endurance is preferentially performed, so that the endurance reduction in the device nearly reaching the write endurance can be suppressed. As a result, expiration of the write endurance of the device can be prevented.

According to the first to third embodiments, the logical disk is divided into regions having fixed sizes, and the write amount is measured in a unit of a region having a predetermined size. The storage device 3 calculates the evaluation value F based on the write amount and the performance value V1, the endurance value V2, the capacity value V3, and the additional writing value V4 of the devices $D_0$ to $D_{N-1}$ and selects a write destination device based on the evaluation value F during data writing to a region having a predetermined size in which data is not written yet. The storage device 3 rearranges the regions having predetermined sizes with respect to the devices $D_0$ to $D_{N-1}$ based on the evaluation value F and performs setting of over-provisioning of the devices $D_0$ to $D_{N-1}$. Consequently, in the first to third embodiments, even if the workload changes, the devices $D_0$ to $D_{N-1}$ can be equalized in endurance, load, performance, and capacity according to the workload.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller comprising:
   a memory which stores first data, that manages a write amount with respect to each of a plurality of regions where a plurality of nonvolatile memories are classified by a predetermined size, and second data that manages a write state corresponding to the plurality of nonvolatile memories;
   an adjustment part which, in writing of data to be written in the plurality of nonvolatile memories, calculates a first evaluation value to each of the plurality of nonvolatile memories, based on the first data and the second data stored in the memory and selects the nonvolatile memory in which the data to be written is to be written, based on the first evaluation value;
   a write part which writes the data to be written in the nonvolatile memory selected by the adjustment part and updates the first data and the second data stored in the memory; and
   a setting change part which calculates a second evaluation value to each of the plurality of nonvolatile memories, based on the first data and the second data stored in the memory after starting to use the plurality of nonvolatile memories and changes setting of a usable capacity with respect to at least one of the plurality of nonvolatile memories, based on the second evaluation value.

2. The memory controller of claim 1, wherein the adjustment part further calculates, when data to be rearranged that are written in the plurality of nonvolatile memories are rearranged in the plurality of nonvolatile memories, a third evaluation value to each of the plurality of nonvolatile memories, based on the first data and the second data,
   selects the nonvolatile memory in which the data to be rearranged is to be rearranged, based on the third evaluation value,
   writes the data to be rearranged in the nonvolatile memory in which the data is to be rearranged, and
   updates the first data and the second data stored in the memory.

3. The memory controller of claim 1, wherein the first data includes first statistical information to the plurality of regions,
   the second data includes second statistical information to the plurality of nonvolatile memories, and
   the adjustment part selects the nonvolatile memory in which the data is to be written such that at least one of a performance evaluation value and an endurance evaluation value to each of the plurality of nonvolatile memories is equalized among the plurality of nonvolatile memories and changes setting of the usable capacity to at least one of the plurality of nonvolatile memories.

4. The memory controller of claim 1, further comprising a change part which changes a value of a parameter used in calculation executed by the adjustment part.

5. A storage device comprising:
   a plurality of nonvolatile memory devices in which setting of a usable capacity is changeable after starting to use;
   a memory which stores first data, that manages a write amount with respect to each of a plurality of regions where storage regions of the plurality of nonvolatile memory devices are classified by a predetermined size, and second data that manages a write state corresponding to the plurality of nonvolatile memory devices;
   an adjustment part which, in writing of data to be written in the plurality of nonvolatile memory devices, calculates a first evaluation value to each of the plurality of nonvolatile memory devices, based on the first data and the second data stored in the memory and selects the nonvolatile memory device in which the data to be written is to be written, based on the first evaluation value;
   a write part which writes the data to be written in the nonvolatile memory device selected by the adjustment part and updates the first data and the second data stored in the memory; and
   a setting change part which calculates a second evaluation value to each of the plurality of nonvolatile memory devices, based on the first data and the second data stored in the memory after starting to use the plurality of nonvolatile memory devices and changes setting of the usable capacity with respect to at least one of the plurality of nonvolatile memory devices, based on the second evaluation value.

6. The storage device of claim 5, wherein the plurality of nonvolatile memory devices are a plurality of disk arrays, and
   each of the plurality of disk arrays includes a plurality of solid state drives.

7. A control method of controlling a storage device comprising a plurality of nonvolatile memory devices in which setting of a usable capacity is changeable after starting to use, the method comprising:
   storing, in a memory, first data, that manages a write amount with respect to each of a plurality of regions where storage regions of the plurality of nonvolatile memory devices are classified by a predetermined size, and second data that manages a write state corresponding to the plurality of nonvolatile memory devices;
   calculating, in writing of data to be written in the plurality of nonvolatile memory devices, a first evaluation value to each of the plurality of nonvolatile memory devices, based on the first data and the second data stored in the memory and selecting the nonvolatile memory device in which the data to be written is to be written, based on the first evaluation value;
   writing the data to be written in the selected nonvolatile memory device and updating the first data and the second data stored in the memory; and
   calculating a second evaluation value to each of the plurality of nonvolatile memory devices, based on the first data and the second data stored in the memory after starting to use the plurality of nonvolatile memory devices and changing setting of the usable capacity with respect to at least one of the plurality of nonvolatile memory devices, based on the second evaluation value.

* * * * *